United States Patent
Tatsukawa et al.

(10) Patent No.: US 7,126,850 B2
(45) Date of Patent: Oct. 24, 2006

(54) SEMICONDUCTOR NONVOLATILE MEMORY DEVICE

(75) Inventors: Naohisa Tatsukawa, Osaka (JP); Atsushi Fujiwara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 111 days.

(21) Appl. No.: 10/946,010

(22) Filed: Sep. 22, 2004

(65) Prior Publication Data

US 2005/0078513 A1    Apr. 14, 2005

(30) Foreign Application Priority Data

Sep. 25, 2003  (JP) .......................... P2003-332691

(51) Int. Cl.
*G11C 11/34* (2006.01)
(52) U.S. Cl. .............................. 365/185.03; 365/185.28
(58) Field of Classification Search ........... 365/185.03, 365/185.28
See application file for complete search history.

(56) References Cited

U.S. PATENT DOCUMENTS

| | | | |
|---|---|---|---|
| 5,818,762 A | 10/1998 | Maari et al. | |
| 6,396,736 B1 * | 5/2002 | Jyouno et al. | 365/185.03 |
| 6,577,530 B1 * | 6/2003 | Muranaka et al. | 365/177 |
| 2003/0151950 A1 | 8/2003 | Tamada et al. | |
| 2003/0227811 A1 | 12/2003 | Sugiura et al. | |

OTHER PUBLICATIONS

"Technology for Improving Reliability In Flash Memory" Chapter 5, Section 4, pp. 223-232 (Japanese), pp. 1-18 (English translation), 1988.

* cited by examiner

*Primary Examiner*—Michael Tran
(74) *Attorney, Agent, or Firm*—McDermott Will & Emery LLP

(57) ABSTRACT

In a nonvolatile memory device, wherein, for example, data "1" is electrically charged, while data "0" is not electrically charged, and memory cells susceptible to charge loss are included, when data in the array 10 is count value of "1">count value of "0", write data is converted to thereby make "1" to "0" and "0" to "1", leading to number of "1"<number of "0", so that a statistical reliability of the data in the array 10 is improved. The data, which is converted and written, is converted in its polarity prior to the conversion when it is read.

20 Claims, 19 Drawing Sheets

F I G. 3
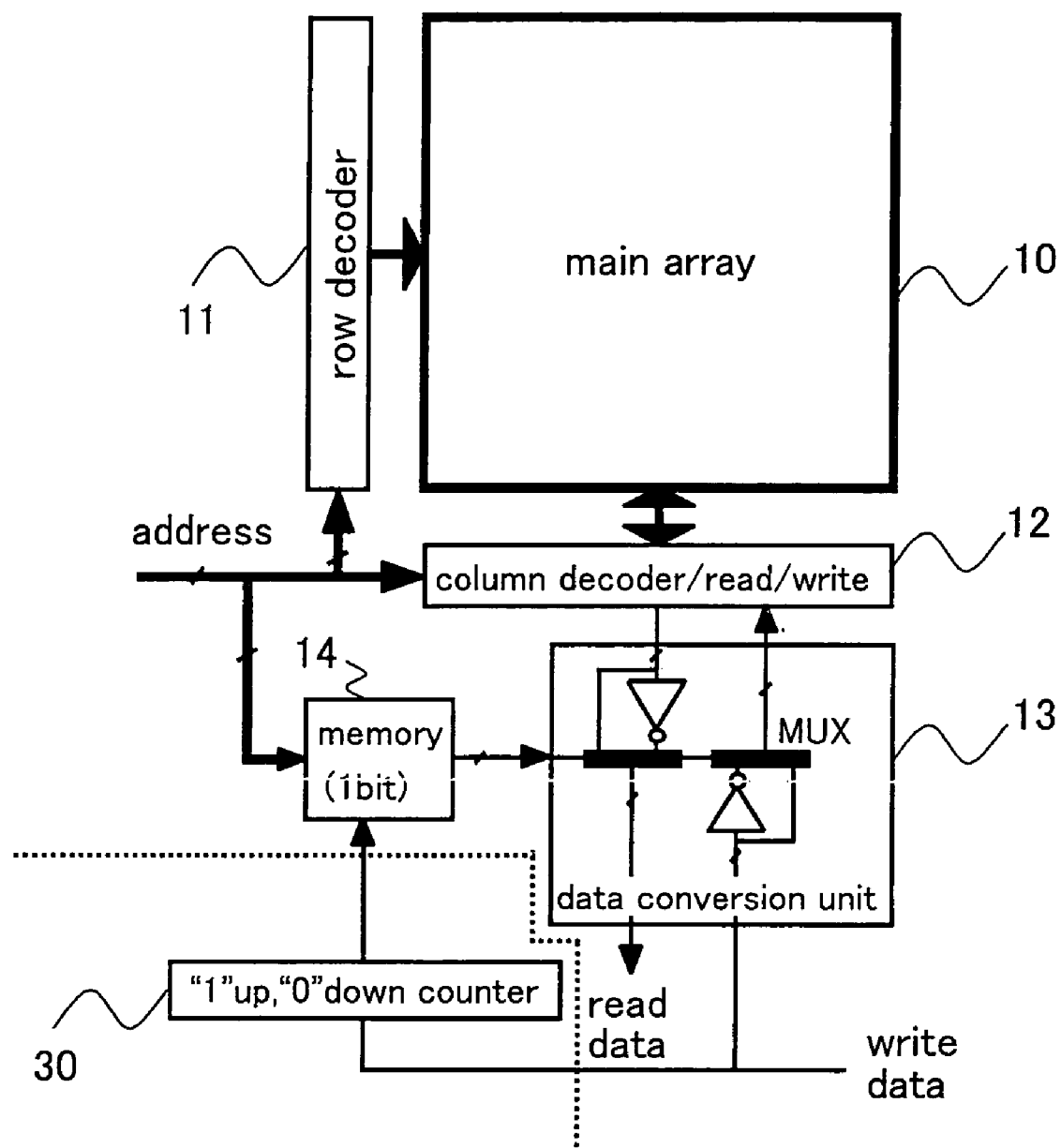

F I G. 8
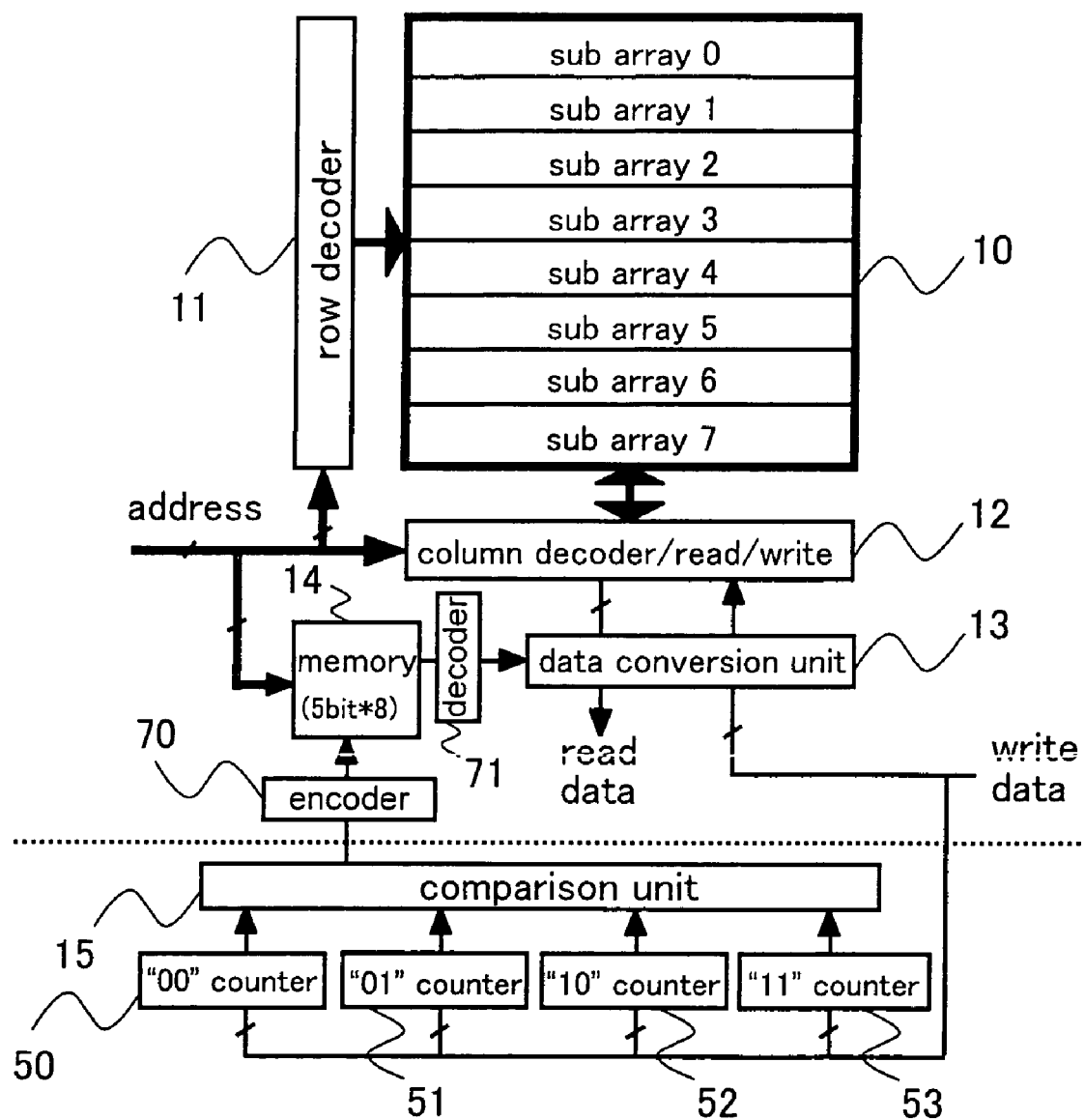

F I G. 10
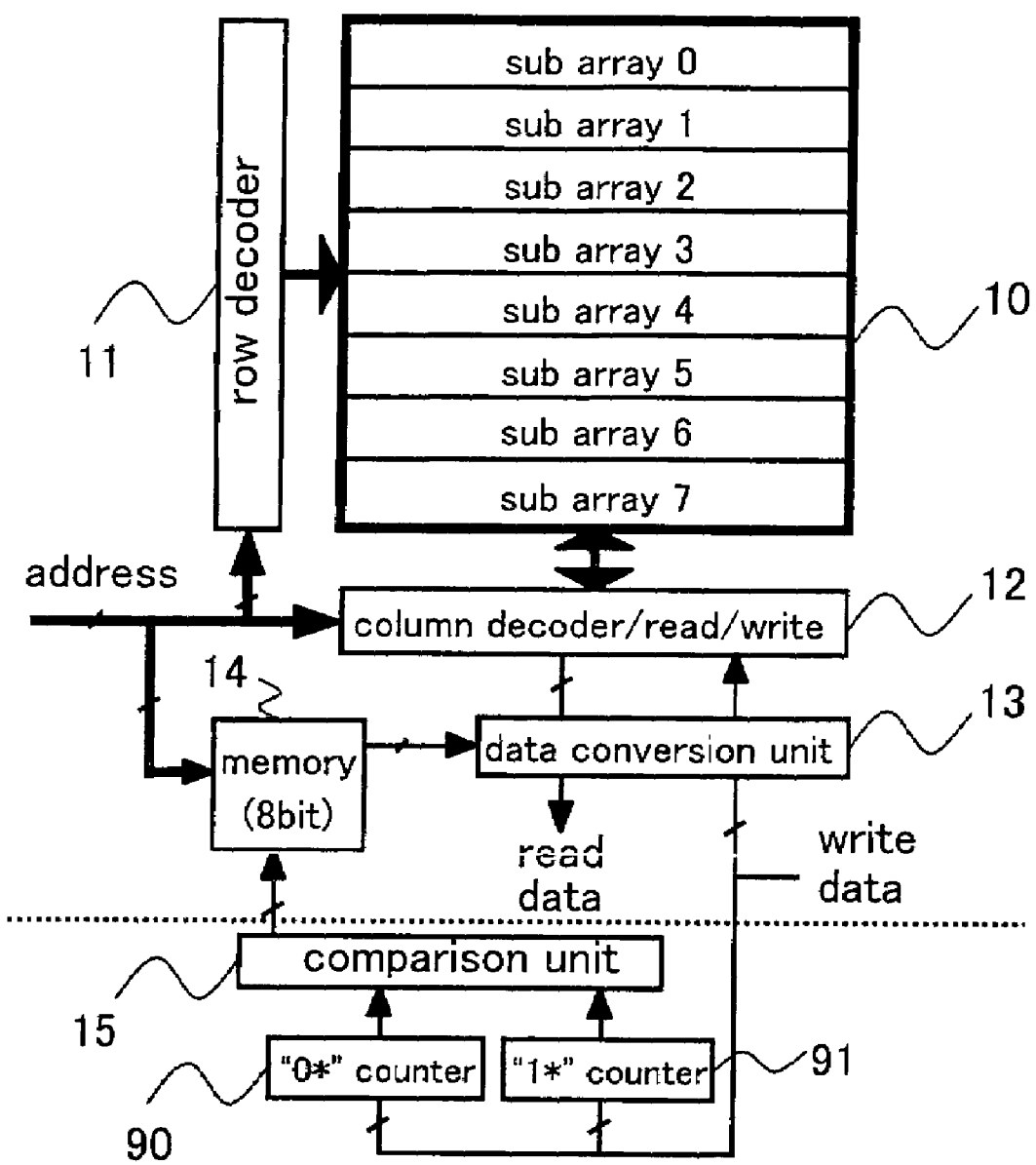

SEMICONDUCTOR NONVOLATILE MEMORY DEVICE

BACKGROUND OF THE INVENTION

The present invention relates to a nonvolatile memory, for example, a semiconductor nonvolatile memory device such as a flash EEPROM.

A floating gate of the flash EEPROM has to be electrically insulated from a silicon substrate and a control gate. On the other hand, it is necessary for electric charge to travel through a tunnel oxide film below the floating gate at the time of writing/erasure. Because the tunnel oxide film is required to satisfy the conflicting functions, there arises the problem of a limited rewriting frequency because the data rewriting deteriorates the tunnel oxide film, which results in a deteriorated data retention characteristic and the like. Therefore, different efforts have been dedicated to the improvement of the data retention characteristic.

However, in recent years, the tunnel oxide film has been thinner because an operation at a lower voltage is requested. Further, a volume of storage charge determining the data has been decreasing because the semiconductor elements are being scaled down. The thinner tunnel oxide film and the data retention characteristic contradict each other. A suitable technology designed to improve the data retention characteristic is being searched.

SUMMARY OF THE INVENTION

Therefore, a main object of the present invention is to provide a semiconductor nonvolatile memory device superior in a data retention characteristic in spite of scaled-down semiconductor elements, in particular, a tunnel oxide film, which is made thinner.

Other objects, features, and advantages of the present invention will be clear from the following description.

In the nonvolatile memory device according to the present invention, when data is written, a bit conversion is executed to the data so that the data has a polarity superior in the data retention characteristic of memory cells.

Further, when "0" degeneracy or "1" degeneracy is generated, the data is first bit-converted and written/read to thereby enable the nonvolatile memory device to be reused.

When charge loss or charge gain is generated, the data is first bit-converted and written/read so that the nonvolatile memory device can be reused.

A more specific description is given below.

1) A nonvolatile memory device according to the present invention comprises:
a memory cell array;
a writing unit for writing data in the array;
first and second counter units for respectively counting threshold increase data and threshold decrease data for the write data with respect to the writing unit;
a comparison unit for comparing the count value of the first counter unit and the count value of the second counter unit;
a memory unit for memorizing the comparison result of the comparison unit; and
a data conversion unit for determining whether or not the polarity of the write data is converted in accordance with the information of the memory unit and outputting the data to the writing unit.

The threshold increase data is data for setting the voltage of the memory cell to a high threshold voltage, while the threshold decrease data is data for setting the voltage of the memory cell to a low threshold voltage. For example, "1" is the threshold increase data, "0" is the threshold decrease data.

According to the foregoing configuration, when the data is written in all of the memory cells in the array, the first counter unit counts the threshold increase data, and the second counter unit counts the threshold decrease data. The count results of the first and second counter units are compared to each other in the comparison unit. The comparison result is memorized in the memory unit, and provided for the data conversion unit. The data conversion unit controls the conversion of the polarity of the write data in accordance with the provided comparison result. More specifically, when count value of the threshold increase data is larger than the count value of the threshold decrease data, the polarity of the data is converted, in which the polarity is converted to the polarity superior in the data retention characteristic of the memory cells. When the count value of the threshold increase data is not larger than the count value of the threshold decrease data, the polarity is not subjected to the conversion and remains unchanged. The data is written in the memory cells from the data conversion unit via the writing unit. In the described manner, the number of the cells having a low threshold voltage (number of low threshold cells) can be made equal to or larger than the number of the cells having a high threshold voltage (number of high threshold cells) to thereby statistically improve the data retention characteristic.

In the foregoing configuration, the array may be divided into a plurality of sub arrays, wherein the memory unit memorizes the comparison result of the comparison unit corresponding to each sub array. According to such a configuration, the number of the low threshold cells can be made equal to or larger than the number of the high threshold cells per sub array to thereby further improve the data retention property compared to the case of dealing with the entire array.

2) A nonvolatile memory device according to the present invention comprises:
a memory cell array;
a writing unit for writing data in the array;
a counter unit for incrementing (or decrementing) the write data with respect to the writing unit in the case of the threshold increase data and decrementing (or incrementing) the write data in the case of the threshold decrease data;
a memory unit for memorizing the count result of the counter unit; and
a data conversion unit for determining whether or not the polarity of the write data is converted in accordance with the information of the memory unit and outputting the data to the writing unit.

The sub arrays may be arranged in the foregoing configuration as in the earlier example.

According to the foregoing configuration, when the data is written in all of the memory cells in the array, the counter unit increments (or decrements) the write data in the case of the threshold increase data, and decrements (or increments) the write data in the case of the threshold decrease data. The count result of the counter unit is memorized in the memory unit, and supplied to the data conversion unit. The data conversion unit controls the conversion of the polarity of the write data in accordance with the supplied count result. In brief, the data conversion unit converts the polarity of the write data when the number of the high threshold cells is larger, that is, the polarity is converted into the polarity superior in the data retention characteristic of the memory cells. When the number of the high threshold cells is not larger, the polarity is not converted remaining unchanged. As described, the number of the low threshold cells can be larger than the number of the high threshold cells, thereby statistically improving the data retention characteristic.

3) A nonvolatile memory device according to the present invention, which is developed to respond to the case where the write data is multi-value data such as quaternary data or octal data, comprises:

a memory cell array;

a writing unit for writing data in the array;

a plurality of counter units for respectively counting a plurality of multi-value data for setting the voltages of the memory cells to a plurality of threshold voltages;

a comparison unit for comparing the respective count values of the plurality counter units;

a memory unit for memorizing the comparison result of the comparison unit; and a data conversion unit for determining whether or not the polarity of the write data is converted in accordance with the information of the memory unit and outputting the data to the writing unit.

The sub arrays may be arranged in the foregoing configuration as in the earlier examples.

According to the foregoing configuration, the plurality of counter units separately counts data of the corresponding threshold voltages. The comparison unit grasps a magnitude correlation among the count results of the respective counter units. The comparison result of the comparison unit is memorized in the memory unit, and supplied to the data conversion unit. The data conversion unit controls the conversion of the polarity of the write data in accordance with the supplied comparison result. More specifically, in a relationship between a ranking of the threshold voltages of the memory cells and the count values of the relevant data, when the number of the high threshold cells is larger than the number of the low threshold cells on average, the polarity of the write data is converted into the polarity superior in the data retention characteristic of the memory cells. When the number of the high threshold cells is not larger than the number of the low threshold cells, the polarity is not converted remaining unchanged. The data is written in the memory cells from the data conversion unit via the writing unit. As described, the number of the low threshold cells can be made larger than the number of the high threshold cells, thereby statistically improving the data retention characteristic.

Further, the memory unit may comprise an encoder in an input portion thereof and a decoder in an output portion thereof in the foregoing configuration. In the case of the multi-value data, data combinations are increased. For example, the combinations in the case of quaternary data are 4!=24, and the combinations in the case of octal data are 8!=40320. When those large numbers of combinations are memorized in the memory unit without change, the problem of an excessive bit numbers arises. Therefore, the data is first encoded by the encoder and memorized in the memory unit, in which manner a required capacity in the memory unit can be reduced. For example, in the case of the quaternary data, $2^5=32>24$ requiring the memory capacity of five bits, while the octal data, $2^{16}=65536>40320$ requiring the memory capacity of 16 bits.

4) A nonvolatile memory device according to the present invention comprises:

a memory cell array;

a writing unit for writing data in the array;

first and second counter units for respectively counting write data with respect to the memory cells, wherein MSB is 1, and write data with respect to the memory cells, wherein MSB is 0;

a comparison unit for comparing the count values of the first and second counter units;

a memory unit for memorizing the comparison result of the comparison unit; and a data conversion unit for determining whether or not the polarity of the write data is converted based on the information of the memory unit and outputting the data to the writing unit.

The sub arrays may be arranged in the foregoing configuration as in the earlier examples.

The first and second counter units are, for example, as follow. When the quaternary data is written, a "1*" counter for counting "10" and "11" corresponds to the first counter unit, and a "0*" counter for counting "00" and "01" corresponds to the second counter unit.

According to the foregoing configuration, in the same manner as in 3), in the relationship between the ranking of the threshold voltages of the memory cells and the count values of the relevant data, when the number of the high threshold cells is larger than the number of the low threshold cells on average, the polarity of the write data is converted. Thereby, the number of the low threshold cells can be made larger than the number of the high threshold cells, thereby statistically improving the data retention characteristic.

5) A nonvolatile memory device according to the present invention comprises:

a memory cell array;

a writing unit for writing data in the array;

a counter unit for counting data for setting the voltages of the memory cells to a maximum threshold voltage or data for setting the voltages of the memory cells to a minimum threshold voltage;

a comparison unit for comparing the count value of the counter unit and half a value of the total number of the memory cells in the array;

a memory unit for memorizing the comparison result of the comparison unit; and a data conversion unit for determining whether or not the polarity of the write data is converted in accordance with the information of the memory unit and outputting the data to the writing unit.

The sub arrays may be arranged in the foregoing configuration as in the earlier examples.

According to the foregoing configuration, as in the examples mentioned earlier, in the relationship between the ranking of the threshold voltages of the memory cells and the count values of the relevant data, when the number of the maximum threshold cells is equal to or exceeds half the value of the total number of the memory cells, the polarity of the write data is converted. Thereby, the number of the low threshold cells can be made equal to or exceeds the half of the total number of the memory cells, and the data retention characteristic can be accordingly statistically improved.

6) A nonvolatile memory device according to the present invention comprises:

a memory cell array;

a writing unit for writing data in the array;

a counter unit for counting data for setting the voltages of memory cells to a maximum threshold voltage or data for setting the voltages of the memory cells to a minimum threshold voltage, wherein MSB is 1 when the count value reaches half a value of the total number of the memory cells in the array;

a memory unit for memorizing the MSB of the counter unit; and a data conversion unit for determining whether or not the polarity of the write data is converted in accordance with the information of the memory unit and outputting the data to the writing unit.

The sub arrays may be arranged in the foregoing configuration as in the earlier examples.

According to the foregoing configuration, as in the case of 3), in the relationship between the ranking of the threshold voltages of the memory cells and the count values of the relevant data, when the number of the maximum threshold cells is equal to or exceeds the half of the total number of the memory cells, the polarity of the write data is converted. Thereby, the number of the low threshold cells can be equal to or exceeds the half of the total number of the memory cells, and the data retention characteristic can be accordingly statistically improved.

Further, in terms of reading the data,

A nonvolatile memory device according to the present invention comprises:

a memory cell array;

a reading unit for reading data whose polarity is converted and written in the memory cells;

a memory unit for memorizing data conversion information; and a data conversion unit for restoring the data from the reading unit to data prior to the conversion in accordance with the data conversion information of the memory unit.

The sub arrays may be arranged in the foregoing configuration as in the earlier examples.

According to the foregoing configuration, though the data is converted in its polarity and written in the memory cells to improve the data retention characteristic, when the data is read, the polarity of data is restituted to the polarity, which is the same as that of the write data. Thereby, the data is correctly read.

7) A nonvolatile memory device according to the present invention comprises:

a memory cell array;

a writing unit for writing data in the array;

a memory unit for memorizing data conversion information; and a data conversion unit for converting data in a memory cell subjected to the generation of "0" degeneracy or "1" degeneracy in accordance with the data conversion information and outputting the data to the writing unit.

The sub arrays may be arranged in the foregoing configuration as in the earlier examples.

According to the foregoing configuration, the nonvolatile memory device can still be used in the presence of one memory cell subjected to the generation of the "0" degeneracy or "1" degeneracy.

Further, in terms of reading the data,

A nonvolatile memory device according to the present invention comprises:

a memory cell array;

a reading unit for reading data in the memory cell subjected to the generation of the "0" degeneracy or "1" degeneracy, which is written after the conversion;

a memory unit for memorizing the data conversion information; and a data conversion unit for restoring the data from the reading unit to the data prior to the conversion in accordance with the data conversion information of the memory unit.

The sub arrays may be arranged in the foregoing configuration as in the earlier examples.

According to the configuration, the nonvolatile memory device can be reused despite the generation of "0" degeneracy or "1" degeneracy. Therefore, though the write data is converted in its polarity and written, the data reading can be correctly executed by restituting the polarity of the data to the polarity same as that of the write data.

8) A nonvolatile memory device according to the present invention comprises:

a memory cell array;

a writing unit for writing data in the array;

a memory unit for memorizing an address and I/O of a memory cell where charge loss or charge gain is generated;

a comparison unit for comparing the address of the memory unit and an address inputted for writing the data in the array and outputting the comparison result together with the I/O information; and a data conversion unit for determining whether or not the polarity of the write data is converted in accordance with the comparison result and the I/O information of the comparison unit and outputting the data to the writing unit.

According to the foregoing configuration, the threshold voltage of the memory cell where the charge loss is generated is maintained low, or the threshold voltage of the memory cell where the charge gain is generated is maintained high, to thereby enable the nonvolatile memory device to be reused.

9) A nonvolatile memory device according to the present invention, which is developed to respond to the case where the write data is multi-value data such as quaternary data or octal data, comprises:

a memory cell array;

a writing unit for writing data in the array;

a memory unit for memorizing data of a memory cell where charge loss or charge gain is generated; and a data conversion unit for determining whether or not the polarity of the write data is converted in accordance with the information of the memory unit and outputting the data to the writing unit.

The sub arrays may be arranged in the foregoing configuration as in the earlier examples.

According to the foregoing configuration, the data is converted in accordance with the data of the memory cell where the charge loss or charge gain is generated. Therefore, the nonvolatile memory device, which deals with the multi-value data, can still be reused.

Further, in terms of reading the data,

A nonvolatile memory device according to the present invention comprises:

a memory cell array;

a reading unit for reading the data of the memory cell subjected to the generation of the charge loss or charge gain, which is written after the conversion;

a memory unit for memorizing data conversion information; and a data conversion unit for restoring the data from the reading unit to the data prior to the conversion in accordance with the data conversion information of the memory unit.

The sub arrays may be arranged in the foregoing configuration as in the earlier examples.

According to the foregoing configuration, the nonvolatile memory device can be reused despite the generation of the charge loss or charge gain. Therefore, though the data is converted in its polarity and written in the memory cells, when the data is read, the polarity of the data is restituted to the polarity, which is the same as that of the write data. Thereby, the data is correctly read.

As is clear from the description so far, the respective components may be comprised of hardware or software.

The foregoing and other aspects become apparent from the following description of the invention when considered in conjunction with the accompanying drawing figures.

BRIEF DESCRIPTION OF THE DRAWINGS

FIG. 3 is a block diagram illustrating a configuration of a nonvolatile memory device according to an embodiment 2 of the present invention.

FIG. 8 is a block diagram illustrating a configuration of a nonvolatile memory device according to still another modification of the embodiment 3.

FIG. 10 is a block diagram illustrating a configuration of a nonvolatile memory device according to a modification of the embodiment 4.

In all these figures, like components are indicated by the same numerals

DESCRIPTION OF THE PREFERRED EMBODIMENTS

Figure 1:
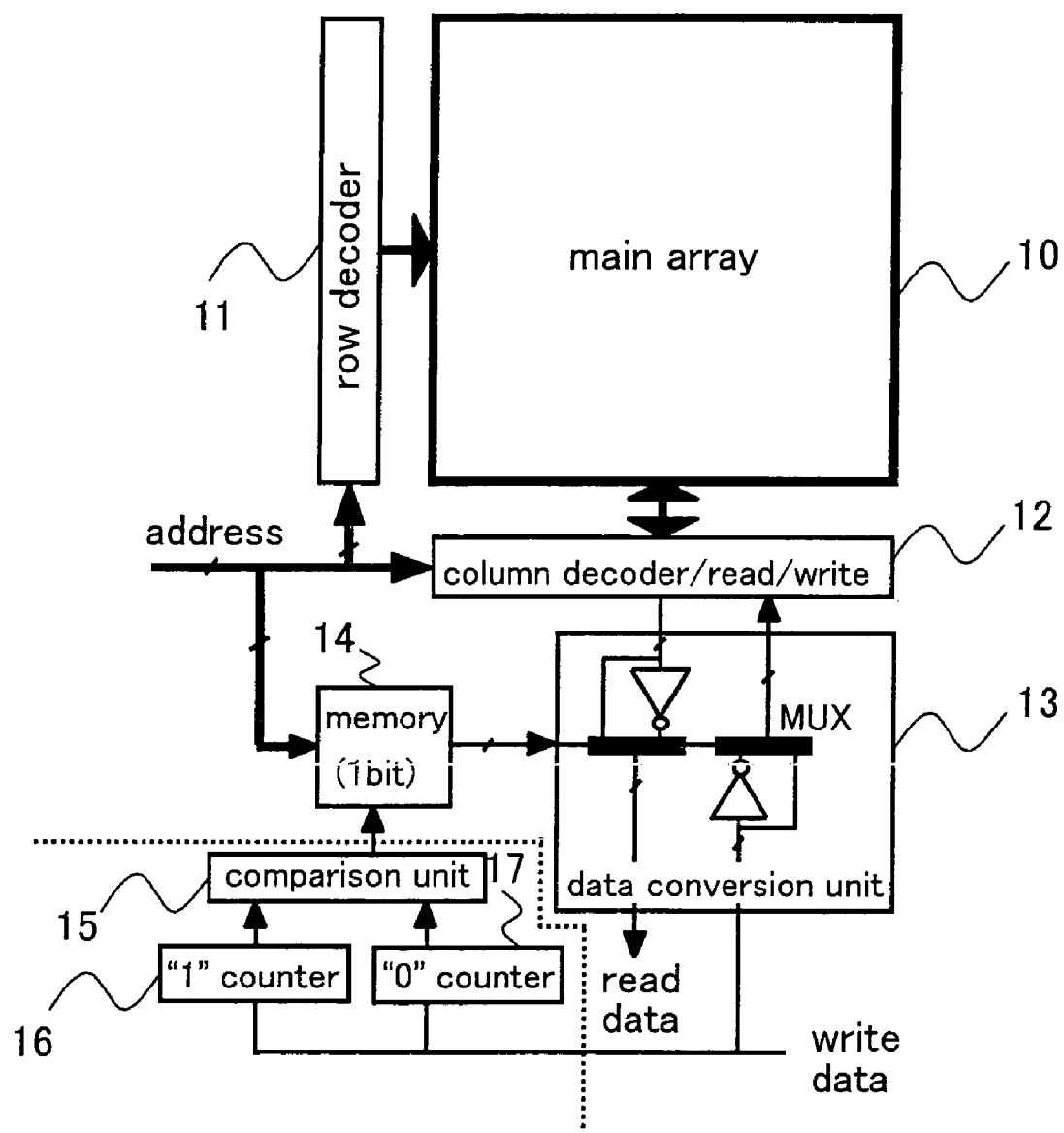
FIG. 1 is a block diagram illustrating a configuration of a nonvolatile memory device according to an embodiment 1 of the present invention.

Hereinafter, preferred embodiments of the present invention are described referring to the drawings. Any component described hereinafter, which is identical to the components described earlier, is provided with the same reference numerals, and the description of those components is partly omitted.

Embodiment 1

In FIG. 1 showing a nonvolatile memory device according to an embodiment 1 of the present invention, a reference numeral 10 denotes a nonvolatile memory cell array for memorizing binary information, a reference numeral 11 denotes a row decoder for driving word lines in the array 10, and a reference numeral 12 denotes a column decoder/read/write circuit corresponding to a writing unit and a reading unit. The column decoder/read/write circuit 12 has a function of driving bit lines in the array 10 and a function of writing/reading data with respect to the array 10. A reference numeral 13 denotes a data conversion unit for bit-converting write data and read data. A reference numeral 16 denotes a "1" counter for counting only "1" in the write data. A reference numeral 17 denotes a "0" counter for counting only "0" in the write data. A reference numeral 15 denotes a comparison unit for comparing the count value of the "1" counter 16 and the count value of the "0" counter 17. A reference numeral 14 denotes a memory unit for memorizing the comparison result of the comparison unit 15.

It is assumed here that the memory cell in the array 10 is a device more susceptible to charge loss than charge gain, that is, "1" in the write data increases a threshold voltage of the memory cell, while "0" decreases the threshold voltage of the memory cell. Hereinafter, the threshold voltage is simply referred to as threshold.

When data is written in all of the memory cells in the array 10, "1" in the write data is counted by the "1" counter 16, and "0" is counted by the "0" counter 17. The comparison unit 15 compares the count value of "1" and the count value of "0". The comparison unit 15 writes "H" when there is more "1" than "0", and writes "L" when there is more "0" than "1" or when "1" and "0" are equal in number in the memory unit 14 (or "H" may be written when they are equal).

The data conversion unit 13 inverts a logic of the write data when the data of the memory unit 14 is "H", while maintains the current logic without change when the data of the memory unit 14 is "L". When the logic is determined by the data conversion unit 13, the data is written in all of the memory cells.

When the data is read from the memory cells in the array 10 via the column decoder/read/write circuit 12, the data conversion unit 13 restores the read data to the data prior to the conversion and outputs it. The restoration of the data is executed based on the data of the memory unit 14.

In the present embodiment, the polarity of the data is first converted into a polarity advantageous for data retention, and then written in the memory cells. Therefore, the number of the low threshold cells can be made larger than the number of the high threshold cells, which improves a data retention characteristic.

Figure 2:
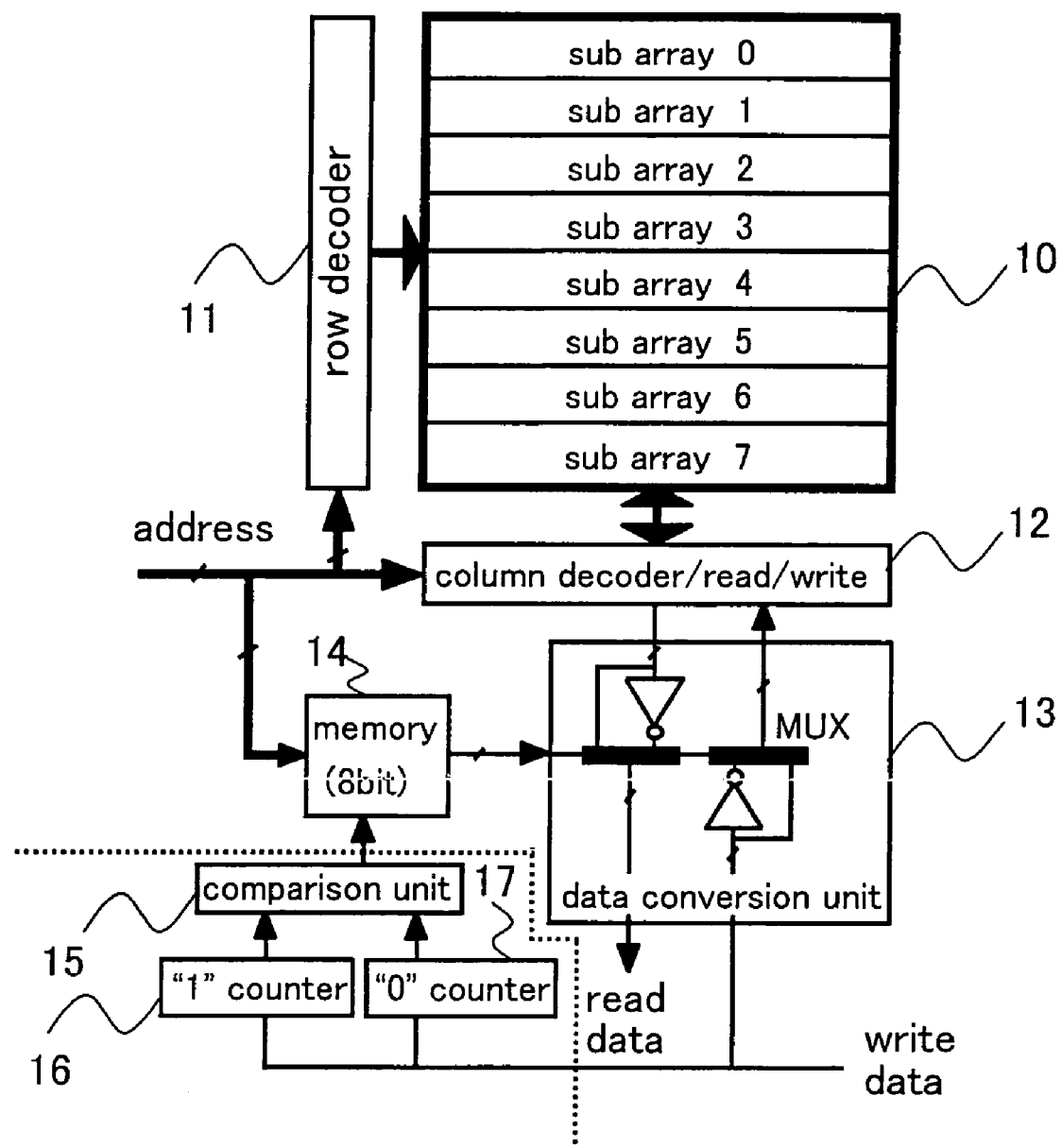
FIG. 2 is a block diagram illustrating a configuration of a nonvolatile memory device according to a modification of the embodiment 1.

Further, as shown in FIG. 2, the array 10 may be divided into a plurality (for example, eight) of sub arrays, wherein the data conversion unit 13 controls each sub array. In that case, the memory unit 14 has the number of bits corresponding to the number of the divided sub arrays. In the foregoing configuration, the data conversion is realized per sub array, which leads to a further improvement of the data retention characteristic compared to the case of dealing with the entire array.

The comparison unit 15, "1" counter 16, and "0" counter 17 in an area below a dotted line are not necessarily disposed in the present memory device, and may be disposed in an external apparatus such as a writer.

Embodiment 2

In FIG. 3 showing a nonvolatile memory device according to an embodiment 2 of the present invention, a reference numeral 30 denotes an up/down counter for incrementing the write data when the write data is "1" and decrementing the write data when the write data is "0". Any other component in the drawing is identical to those in FIG. 1. Therefore, they are simply provided with the same reference numerals, thereby omitting the description.

The memory cell in the present embodiment is the device more susceptible to the charge loss than the charge gain as in the previous embodiment.

When data is written in all of the memory cells, the up/down counter 30 increments the write data when the write data is "1", and decrements the write data when the write data is "0". The up/down counter 30 writes "H" in the memory unit 14 when the count value is positive, and writes "L" in the memory unit 14 when the count value is negative or "0" (or "H" may be written in the case of "0"). The data conversion unit 13 inverts the logic of the write data when the data of the memory unit 14 is "H", and maintains the logic without change when the data of the memory unit 14 is "L".

Meanwhile, when the data is read from the memory cells, the data conversion unit 13 restores the read data to the data prior to the conversion based on the data of the memory unit 14 and outputs it.

According to the present embodiment, as in the previous embodiment, the polarity of the data is first converted to the polarity advantageous for the data retention and written in the memory cells. Therefore, the number of the low threshold cells can be made larger than the number of the high threshold cells, which successfully improves the date retention characteristic.

Figure 4:
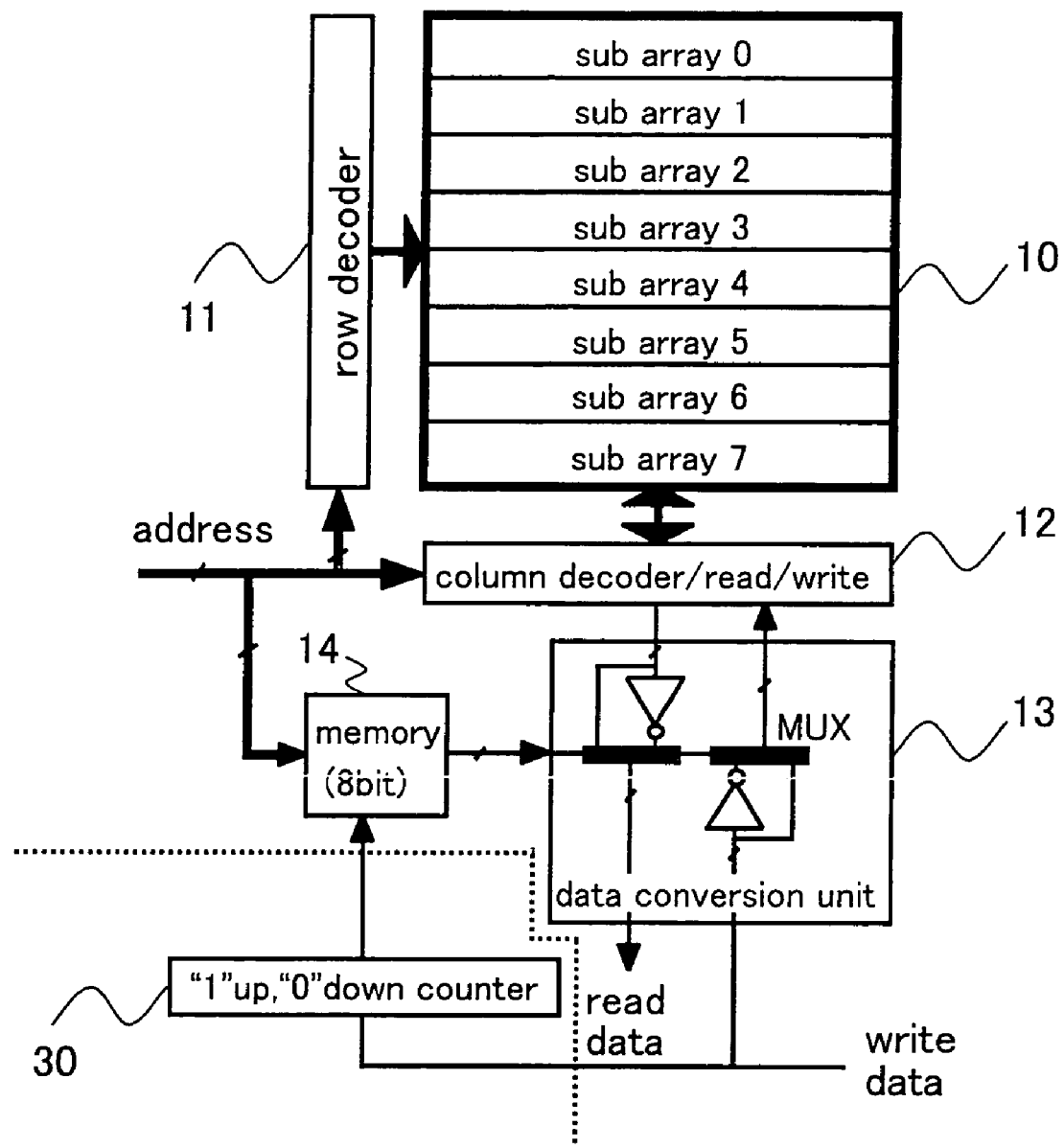
FIG. 4 is a block diagram illustrating a configuration of a nonvolatile memory device according to a modification of the embodiment 2.

In the present embodiment, as shown in FIG. 4, the array 10 may be divided into a plurality of sub arrays, wherein the data conversion is executed in each sub array as in the previous embodiment.

The up/down counter 30 in an area below a dotted line is not necessarily disposed in the present memory device, and may be disposed in an external apparatus such as a writer.

Embodiment 3

An embodiment 3 of the present invention responds to the case where the write data is quaternary information.

Figure 5B:
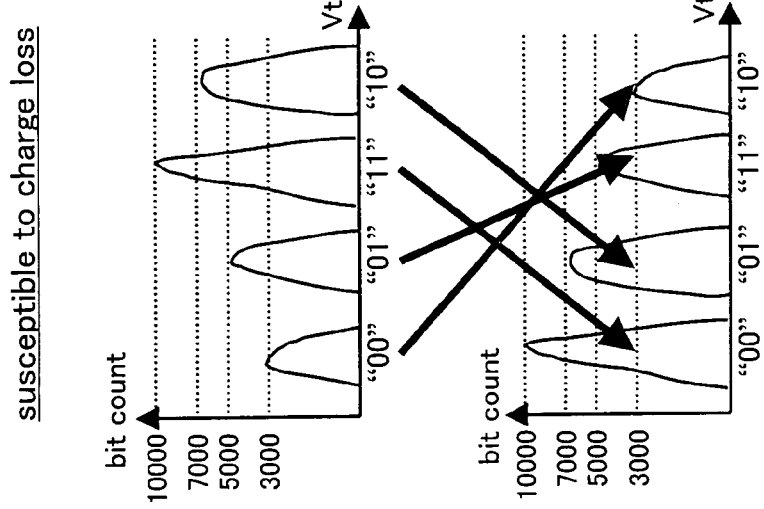
FIG. 5B shows graphs illustrating an operation of the nonvolatile memory device of FIG. 5A.
Figure 5A:
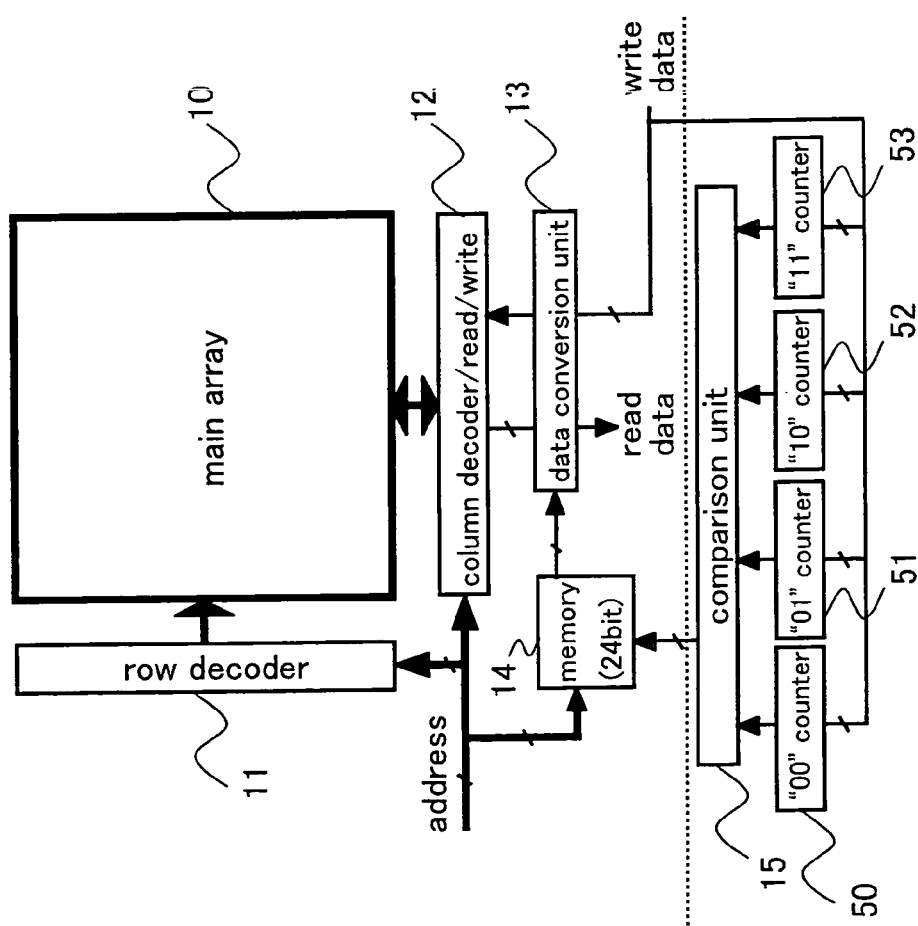
FIG. 5A is a block diagram illustrating a configuration of a nonvolatile memory device according to an embodiment 3 of the present invention.

In FIG. 5A showing a nonvolatile memory device according to the embodiment 3, a reference numeral 10 denotes a memory cell array for memorizing the quaternary information, a reference numeral 50 denotes a counter for counting only "00" in the write data, a reference numeral 51 denotes a counter for counting only "01" in the write data, a reference numeral 52 denotes a counter for counting only "10" in the write data, and a reference numeral 53 denotes a counter for counting only "11" in the write data. Any other component in the drawing is identical to those in FIG. 1. Therefore, they are simply provided with the same reference numerals, thereby omitting the description.

The memory cell in the present embodiment is the device more susceptible to the charge loss than the charge gain as in the previous embodiments. Further, as shown in FIG. 5, in a relationship between the threshold voltages of the memory cells and the write data, the data arrangement is "10", "11", "01" and "00" in the order of the higher threshold.

When data is written in all of the memory cells, the counter 50 counts "00", the counter 51 counts "01", the counter 52 counts "10", and the counter 53 counts "11". It is assumed here that the combination of "11", "10", "01", and "00", for example, in the order of the higher ranking of the count values, is obtained. The comparison unit 15 writes data, "H", in a bit position of the memory unit 14 corresponding to the combination of "11", "10", "01", and "00", which is arranged in the order of the higher ranking of the count values selected from 24 combinations (=4! combinations).

The data conversion unit 13 confirms the bit position of "H" in 24 bits outputted from the memory unit 14, and bit-converts the data. In the present example, "11" of the highest count value is converted into "00" of the minimum threshold. "10" of the second highest count value is converted into "01" of the second lowest threshold. "01" of the third highest count value is converted into "11" of the third lowest threshold. "00" of the minimum count value is converted into "10" of the highest threshold. As described, the conversion is executed so that the ranking of the count values is reverse to the ranking of the thresholds.

According to the present embodiment, the number of the maximum threshold cells is reduced by a largest number, the number of the second highest threshold cells is reduced by the second largest number, and the number of the third highest threshold cells is reduced by the third largest number to thereby increase the number of the minimum threshold cells to be the most among the cells. As a result, the data retention characteristic is statistically improved.

Figure 7:
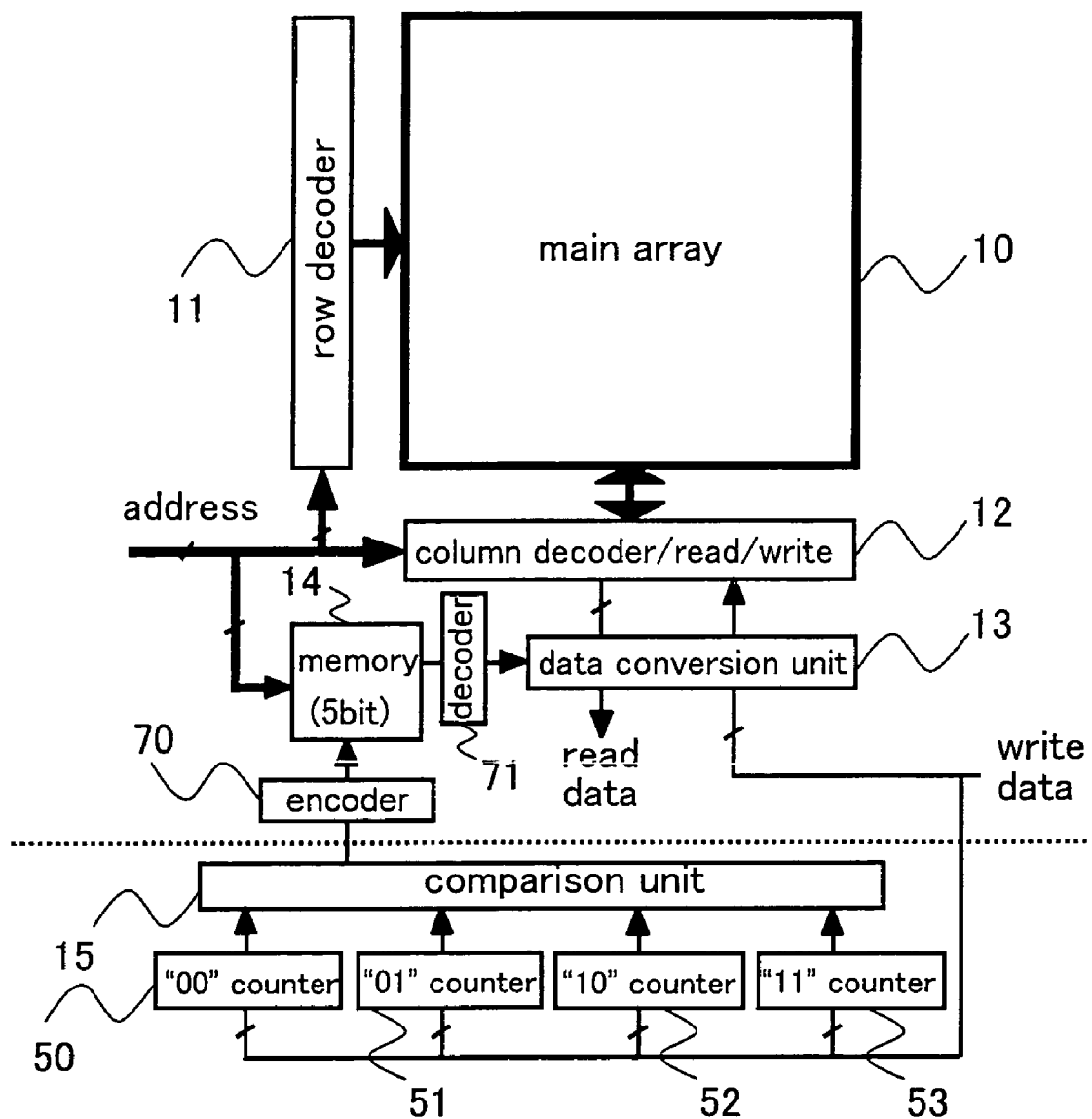
FIG. 7 is a block diagram illustrating a configuration of a nonvolatile memory device according to another modification of the embodiment 3.

In the foregoing example, the quaternary information was described. However, the multi-value information, such as octal information and hexadecimal information, can be applied as well, in which case the data retention characteristic can also be statistically improved. It is noted, however, that the octal information and hexadecimal information result in such large numbers of data combinations as, respectively, 8!=40320 and 16! combinations, and the bit numbers of the memory unit 14 are thereby increased. To deal with the problem, as shown in FIG. 7, an encoder 70 and a decoder 71 are respectively provided in an input portion and an output portion of the memory unit 14, which successfully achieves the reduction of the bit numbers of the memory unit 14.

Figure 6:
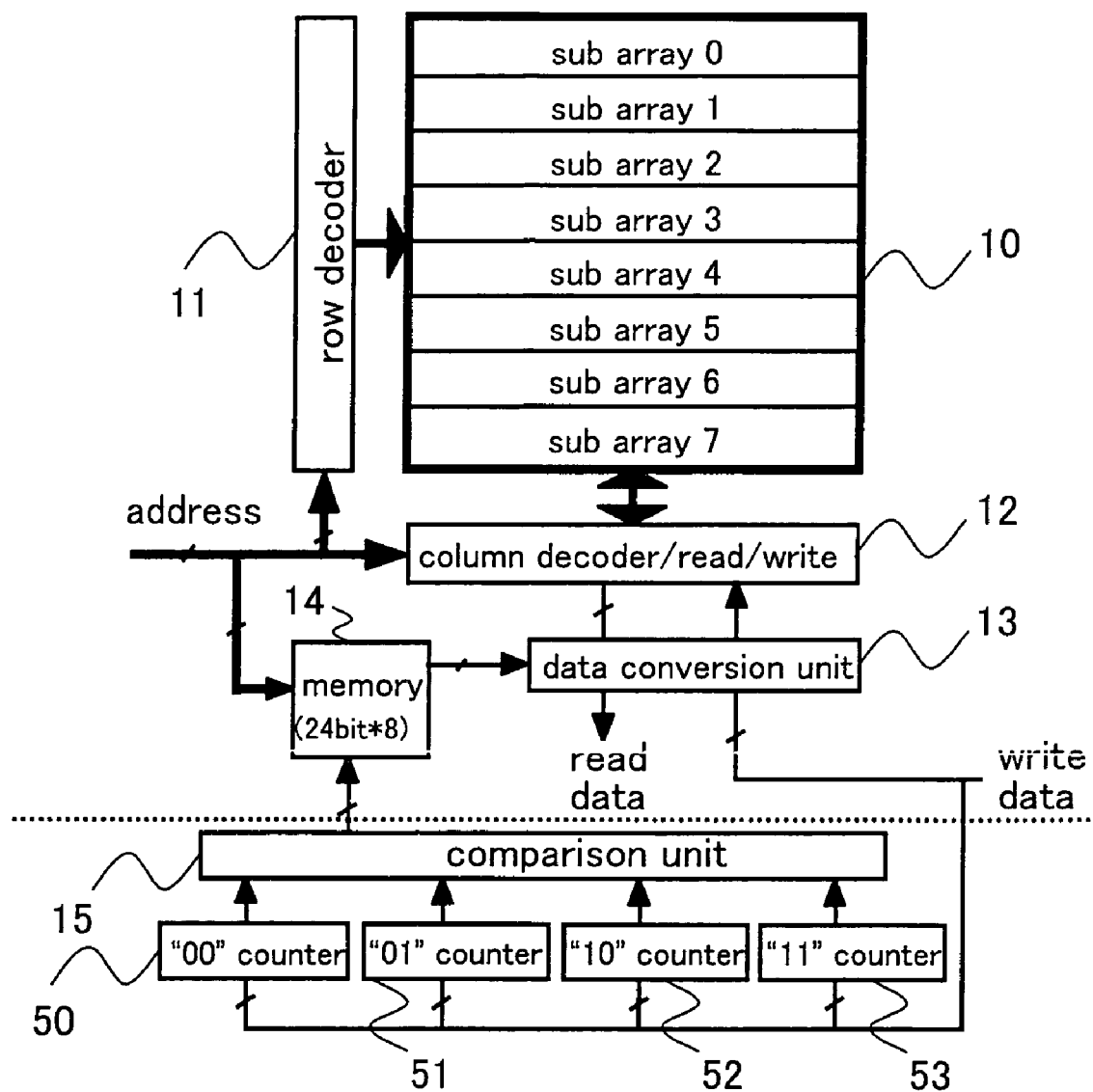
FIG. 6 is a block diagram illustrating a configuration of a nonvolatile memory device according to a modification of the embodiment 3.

Also in the present embodiment, the array 10 may be divided into a plurality of sub arrays, as shown in FIGS. 6 and 8, to thereby execute the data conversion per sub array.

The comparison unit 15, "00" counter 50, "01" counter 51, "10" counter 52, and "11" counter 53 in an area below a dotted line are not necessarily disposed in the present memory device, and may be disposed in an external apparatus such as a writer.

Embodiment 4

Figure 9B:
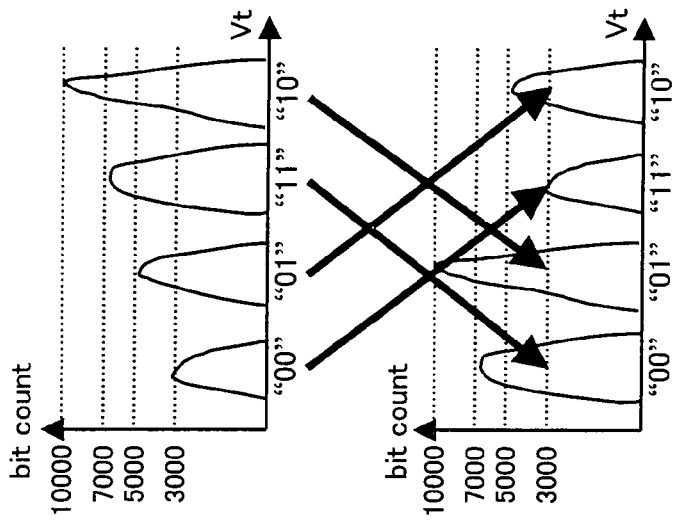
FIG. 9B shows graphs illustrating an operation of the nonvolatile memory device of FIG. 9A.
Figure 9A:
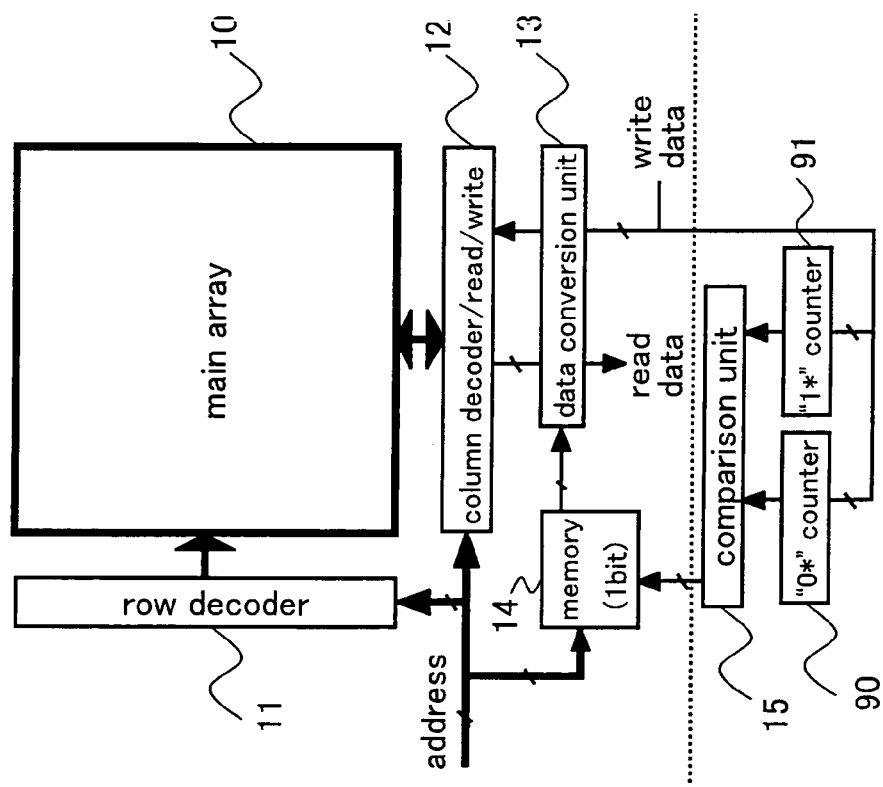
FIG. 9A is a block diagram illustrating a configuration of a nonvolatile memory device according to an embodiment 4 of the present invention.

In FIG. 9A, showing a nonvolatile memory device according to an embodiment 4 of the present invention, a reference numeral 90 denotes a "0*" counter for counting "00" and "01" in the write data, a reference numeral 91 denotes a "1*" counter for counting "10" and "11". The "0*" counter 90 counts data, wherein MSB is 0, to be written in the memory cells, and the "1*" counter 91 counts data, wherein MSB is 1, to be written in the memory cells. Any other component in the drawing is identical to those in FIG. 1. Therefore, they are simply provided with the same reference numerals, thereby omitting the description.

In the present embodiment, the memory cell in the array 10 is the device more susceptible to the charge loss than the charge gain as in the previous embodiments. Further, as shown in FIG. 9B, in the relationship between the threshold voltages of the memory cells and the write data, the data arrangement is "10", "11", "01" and "00" in the order of the higher threshold.

When data is written in all of the memory cells, the "0*" counter 90 counts "00" and "01". The "1*" counter 91 counts "10" and "11". It is assumed here that the arrangement of "1*" and "0*" in the order of the higher ranking of the count values is obtained. The comparison unit 15 compares the value of the "0*" counter 90 (8000) and the value of the "1*" counter 91 (17000), and writes "H" in the memory unit 14 because the value of the "1*" counter 91 is larger (or "H" may be written when the values are equal to each other). Because the data of the memory unit 14 is "H", the data conversion unit 13 bit-inverts the write data, that is, "00" to "11", "01" to "10", "11" to "00", and "10" to "01", and outputs it.

Meanwhile, when the value of the "1*" counter 91 is smaller than or equal to the value of the "0*" counter 90, the data conversion unit 13 writes "L" in the memory unit 14. In that case, the data conversion unit 13 outputs the write data without change.

According to the present embodiment, when the threshold of the cells present in a larger number in sum total is high, the data is bit-converted. As a result, the data retention characteristic can be statistically improved.

In the present embodiment, the array 10 may be divided into a plurality of sub arrays, as shown in FIG. 10, to thereby execute the data conversion per sub array as in the previous embodiments.

The comparison unit 15, "0*" counter 90, and "1*" counter 91 in an area below a dotted line are not necessarily disposed in the present memory device, and may be disposed in an external apparatus such as a writer.

Embodiment 5

In FIG. 1A showing a nonvolatile memory device according to an embodiment 5 of the present invention, a reference numeral 15 denotes a comparison unit for comparing half a value of the total number of memory cells in the array 10 and a value of a "00" counter 50 or a value of a "10" counter 52, a reference numeral 110 denotes a selector for selecting an output of the comparison unit 15. Any other component in the drawing is identical to those in FIG. 1. Therefore, they are simply provided with the same reference numerals, thereby omitting the description.

Figure 11A:
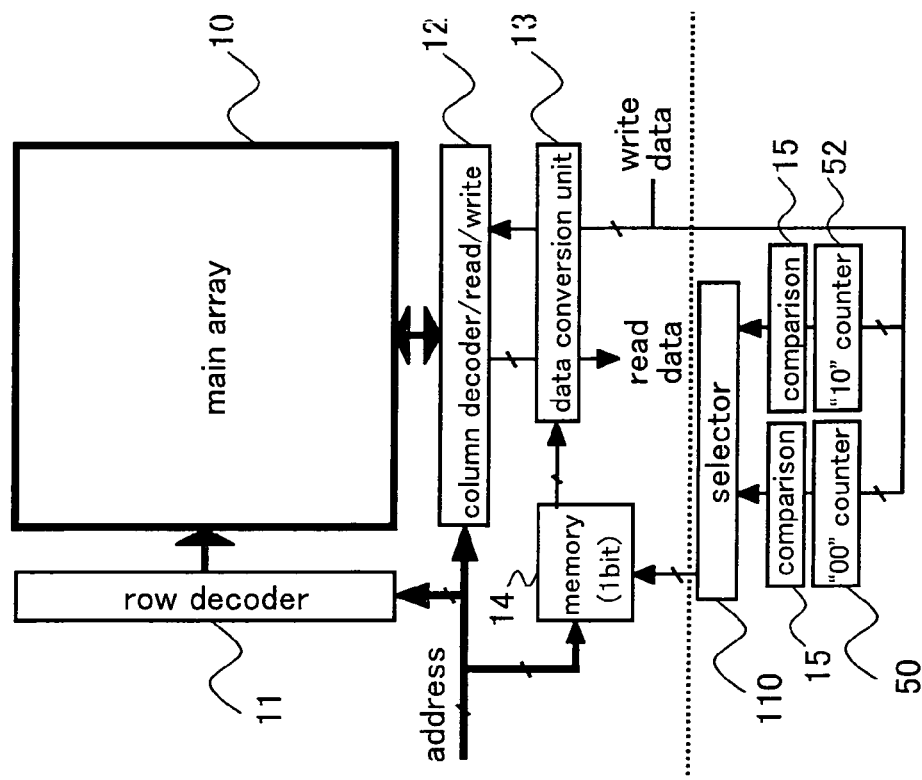
FIG. 11A is a block diagram illustrating a configuration of a nonvolatile memory device according to an embodiment 5 of the present invention.
Figure 11B:
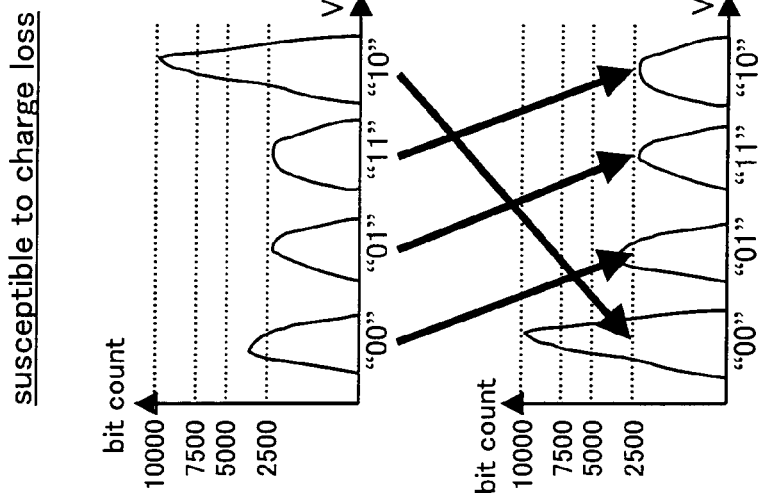
FIG. 11B shows graphs illustrating an operation of the nonvolatile memory device of FIG. 11A.

As shown in FIG. 11B, in the relationship between the thresholds of the memory cells and the write data, the data arrangement is "10", "11" and "00" in the order of the higher threshold.

First, an operation in the case of selecting the "10" counter 52 in the selector 110 is described.

In the case where the memory cell is the device more susceptible to the charge loss than the charge gain, the selector 110 selects the "10" counter 52. When data is written in all of the memory cells, the "10" counter 52 counters "10" of the maximum threshold value. The comparison unit 15 compares half the value of the total number of the cells and the value of the "10" counter 52. In the comparison result, when the value of the "10" counter 52 is larger than the other, "H" is written, and when the value of the "10" counter 52 is smaller than the other, "L" is written in the memory unit 14 via the selector 110. When they are equal to each other in the comparison result, "H" is written. The data conversion unit 13 coverts "10" to "00" of the minimum threshold value, when the data of the memory unit 14 is "H", and shifts the others to the higher values. On the contrary, when the data of the memory unit 14 is "L", the data is outputted unchanged.

Next, an operation in the case of selecting the "00" counter 50 in the selector 110 is described.

In the case where the memory cell is the device more susceptible to the charge gain than the charge loss on the contrary to the earlier description, the selector 110 selects the "00" counter 50. When the data is written in all of the memory cells, the "00" counter 50 counts "00" of the minimum threshold value. The comparison unit 15 compares half the value of the total number of the cells and the value of the counter 50.

In the comparison result, when the value of the "00" counter 50 is larger, "H" is written, and when the value of the "00" counter 50 is smaller, "L" is written in the memory unit 14 via the selector 110. When they are equal to each other in the comparison result, "H" is written. The data conversion unit 13 converts "00" to "10" of the maximum threshold value, when the data of the memory unit 14 is "H", and shifts the others to the lower values. When the data of the memory unit 14 is "L", the data is outputted unchanged.

According to the present embodiment, the logic inversion is executed when the count value of the minimum-threshold bit string is equal to or larger than half the value of the total number of the cells. Therefore, the data retention characteristic is statistically improved.

Figure 12:
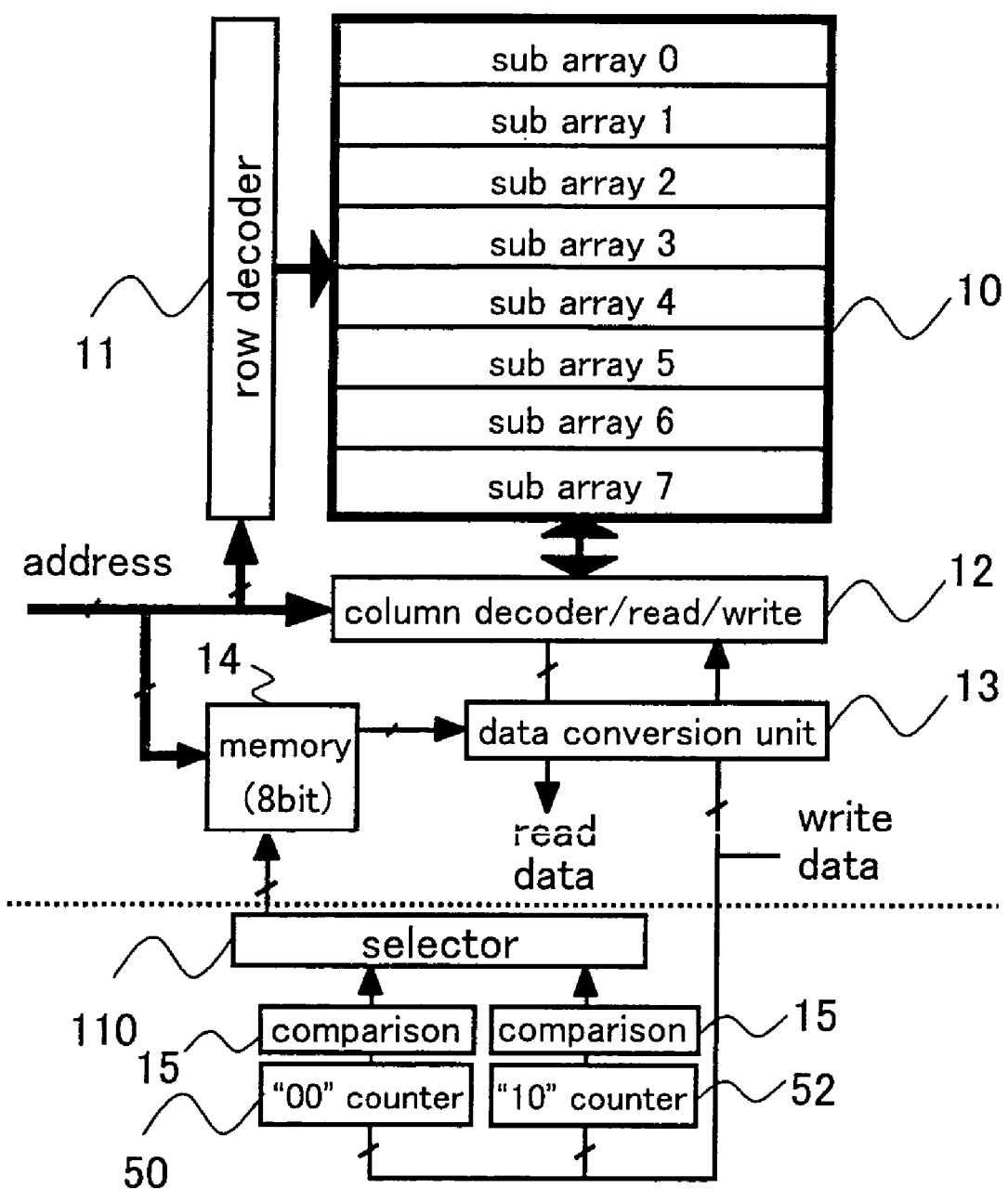
FIG. 12 is a block diagram illustrating a configuration of a nonvolatile memory device according to a modification of the embodiment 5.

In the present embodiment, the array 10 may be divided into a plurality of sub arrays, as shown in FIG. 12, to thereby execute the data conversion per sub array as in the previous embodiments.

The selector 110, comparison unit 15, "00" counter 50, and "10" counter 52 in an area below a dotted line are not necessarily disposed in the present memory device, and may be disposed in an external apparatus such as a writer.

Embodiment 6

Figure 13B:
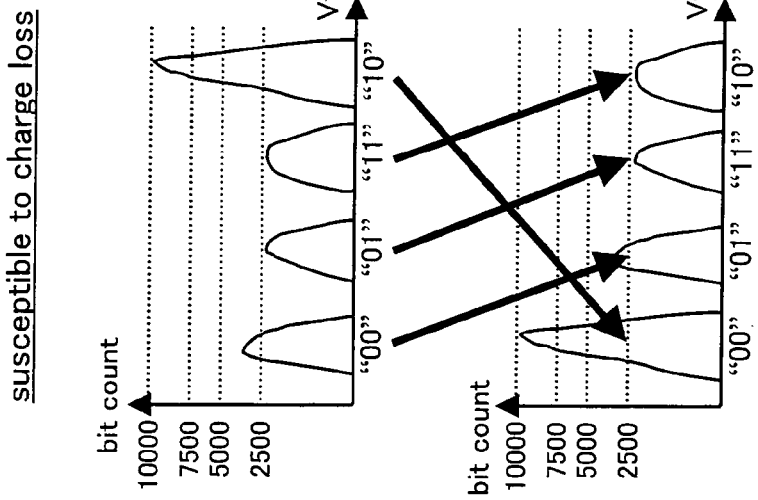
FIG. 13B shows graphs illustrating an operation of the nonvolatile memory device of FIG. 13A.
Figure 13A:
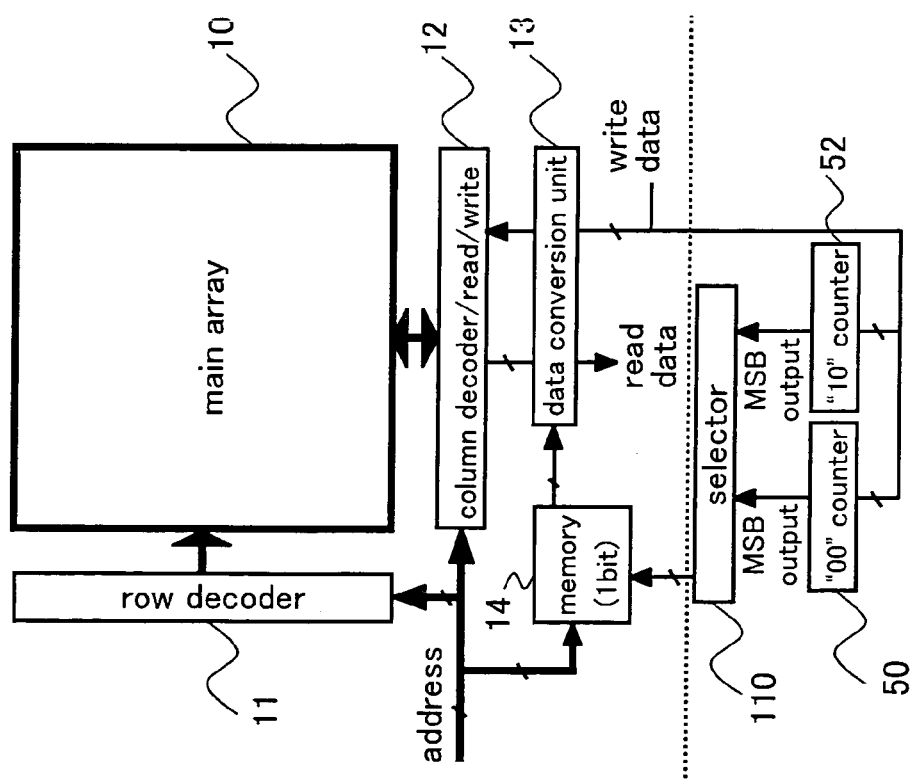
FIG. 13A is a block diagram illustrating a configuration of a nonvolatile memory device according to an embodiment 6 of the present invention.

In FIG. 13A showing a nonvolatile memory device according to an embodiment 6 of the present invention, a reference numeral 50 denotes a "00" counter for counting "00" in the write data, wherein MSB is 1 when the count value reaches half the value of the total number of the cells, and a reference numeral 52 denotes a "10" counter for counting "10" in the write data, wherein MSB is 1 when the count value reaches half the value of the total number of the cells. Any other component in the drawing is identical to those in FIG. 1. Therefore, they are simply provided with the same reference numerals, thereby omitting the description.

As shown in FIG. 13B, in the relationship between the thresholds of the memory cells and the write data, the data arrangement is "10", "11", "01", and "00" in the order of the higher threshold.

First, an operation in the case of selecting the "10" counter 52 in the selector 110 is described.

In the case where the memory cell is the device more susceptible to the charge loss than the charge gain, the selector 110 selects the "10" counter 52. When data is written in all of the memory cells, the "10" counter 52 counts "10" of the maximum threshold value. When the count value of the "10" counter 52 is equal to or larger than half the value of the total number of the cells with MSB being 1, "H" is written, and when the count value of the "10" counter 52 is less than half the value with MSB being 0, "L" is written in the memory unit 14 via the selector 110. The data conversion unit 13 converts "10" in the write data to "00" of the minimum threshold value, when the data of the memory unit 14 is "H", and shifts the others to the higher values. When the data of the memory unit 14 is "L", the data is outputted unchanged.

Next, an operation in the case of selecting the "00" counter 50 in the selector 110 is described.

When the memory cell is, on the other hand, the device more susceptible to the charge gain than the charge loss, the selector 110 selects the "00" counter 50. When the data is written in all of the memory cells, the "00" counter 50 counts "00" of the minimum threshold value. When the count value of the "00" counter 50 is equal to or larger than half the value of the total number of the cells with MSB being 1, "H" is written, when the count value of the "00" counter 50 is less than half the total number of the cells with MSB being 0, "L" is written in the memory unit 14 via the selector 110. The data conversion unit 13 converts "00" in the write data to "10" of the maximum threshold value, and shifts the others to the higher values. When the data of the memory unit 14 is "L", the data is outputted unchanged.

According to the present embodiment, the logic inversion is executed when the count value of the minimum-threshold bit string is equal to or larger than half the value of the total numbers of the cells. Therefore, the data retention characteristic can be statistically improved.

Figure 14:
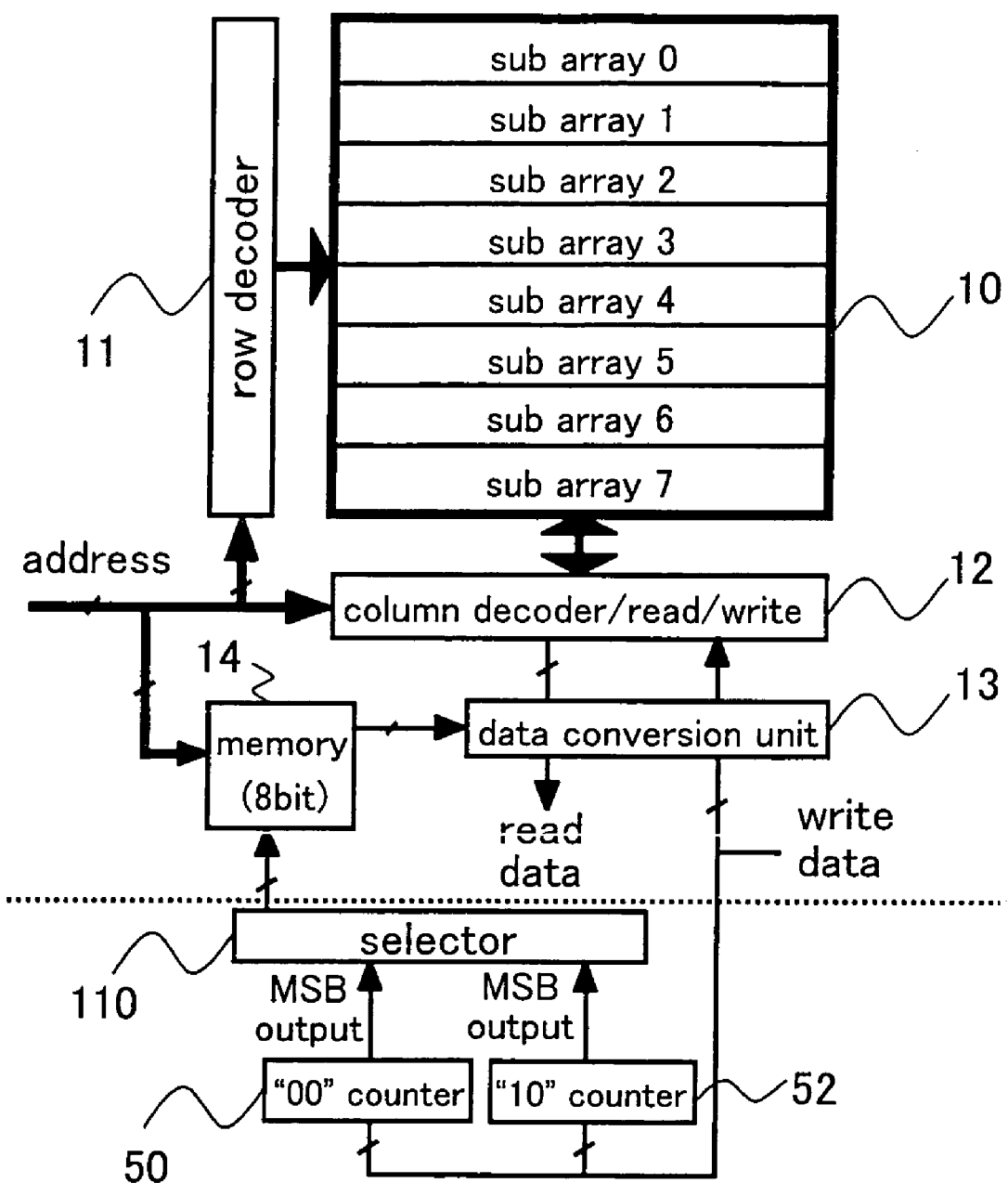
FIG. 14 is a block diagram illustrating a configuration of a nonvolatile memory device according to a modification of the embodiment 6.

In the present embodiment, the array 10 may be divided into a plurality of sub arrays, as shown in FIG. 14, to thereby execute the data conversion per sub array as in the previous embodiments.

The selector 110, "00" counter 50, and "10" counter 52 in an area below a dotted line are not necessarily disposed in the present memory device, and may be disposed in an external apparatus such as a writer.

Embodiment 7

An embodiment 7 of the present invention realizes the reuse of a nonvolatile memory device by converting and writing/reading data with respect to a memory cell subjected to the generation of "0" degeneracy or "1" degeneracy.

Figure 15:
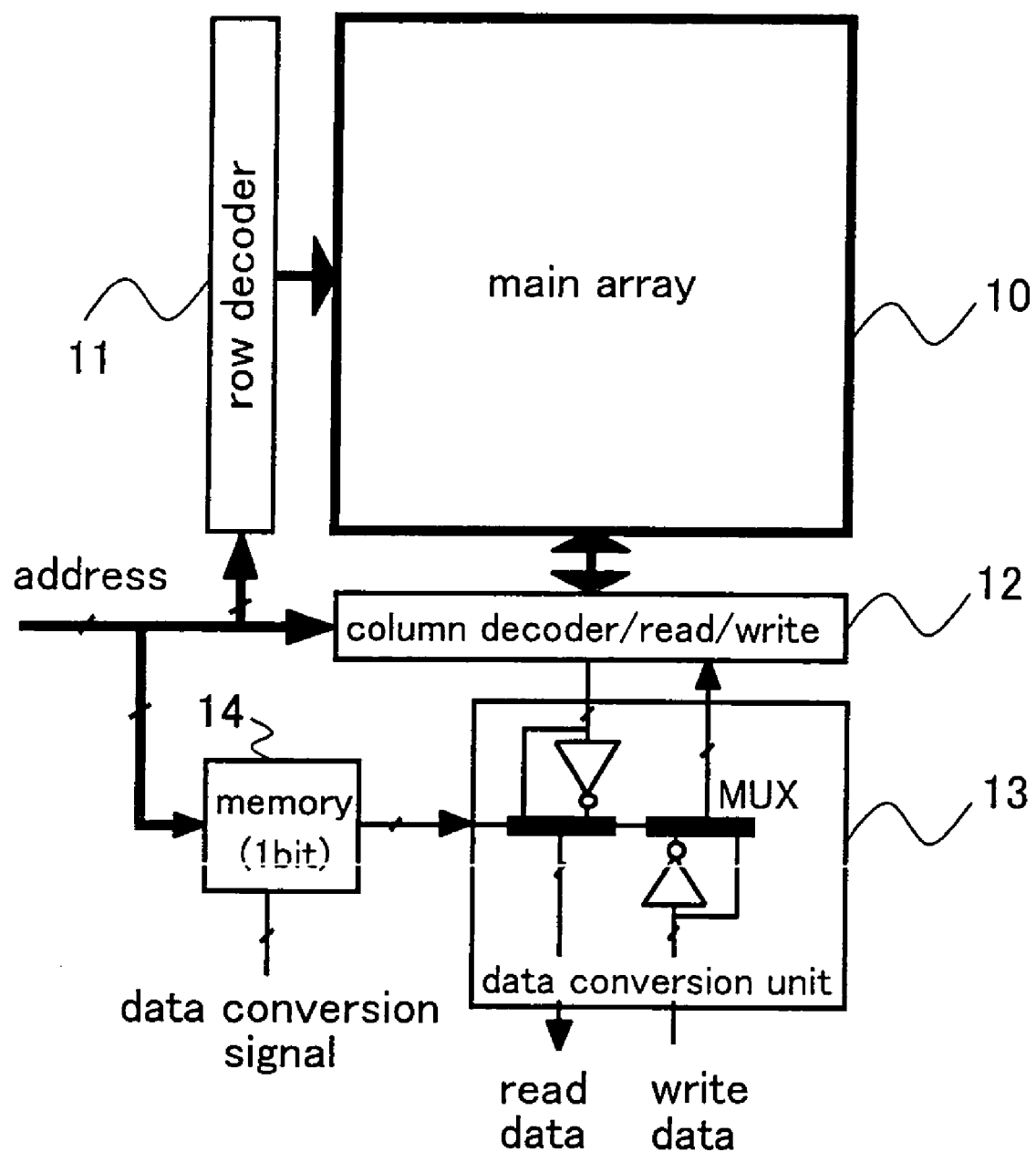
FIG. 15 is a block diagram illustrating a configuration of a nonvolatile memory device according to an embodiment 7 of the present invention.

In FIG. 15 showing a nonvolatile memory device according to the embodiment 7, a reference numeral 14 is a memory unit for memorizing a data conversion signal. The present embodiment does include the "1" counter 16, "0" counter 17, and comparison unit 15 of FIG. 1. Any other component in the drawing is identical to those in FIG. 1. Therefore, they are simply provided with the same reference numerals, thereby omitting the description.

It is assumed here that one of the memory cells in the array 10 undergoes the "0" degeneracy, and "1" in the write data increases the threshold of the memory cells, while "0" decreases the threshold of the memory cells.

When data is written in all of the memory cells in the array 10, the data conversion signal "L" is written in the memory unit 14 to thereby arrange the data conversion unit 13 to be in such a state that the write data is outputted without change.

After the signal is written, the data in all of the memory cells is read via the data conversion unit 13. At that time, one of the memory cells, which is supposed to output "1", is outputting "0", that is, undergoing the "0" degeneracy. In that case, the contents of all of the memory cells in the array 10 are erased by an erasure circuit (not shown), and turned to "0". Next, the data conversion signal "H" is written in the memory unit 14, and then the same data as the previously written data is written again in the memory cells in the array 10. The data conversion unit 13 inverts the logic of the write data.

According to the present embodiment, the nonvolatile memory device can still be reused in the presence of one memory cell undergoing the "0" degeneracy.

Figure 16:
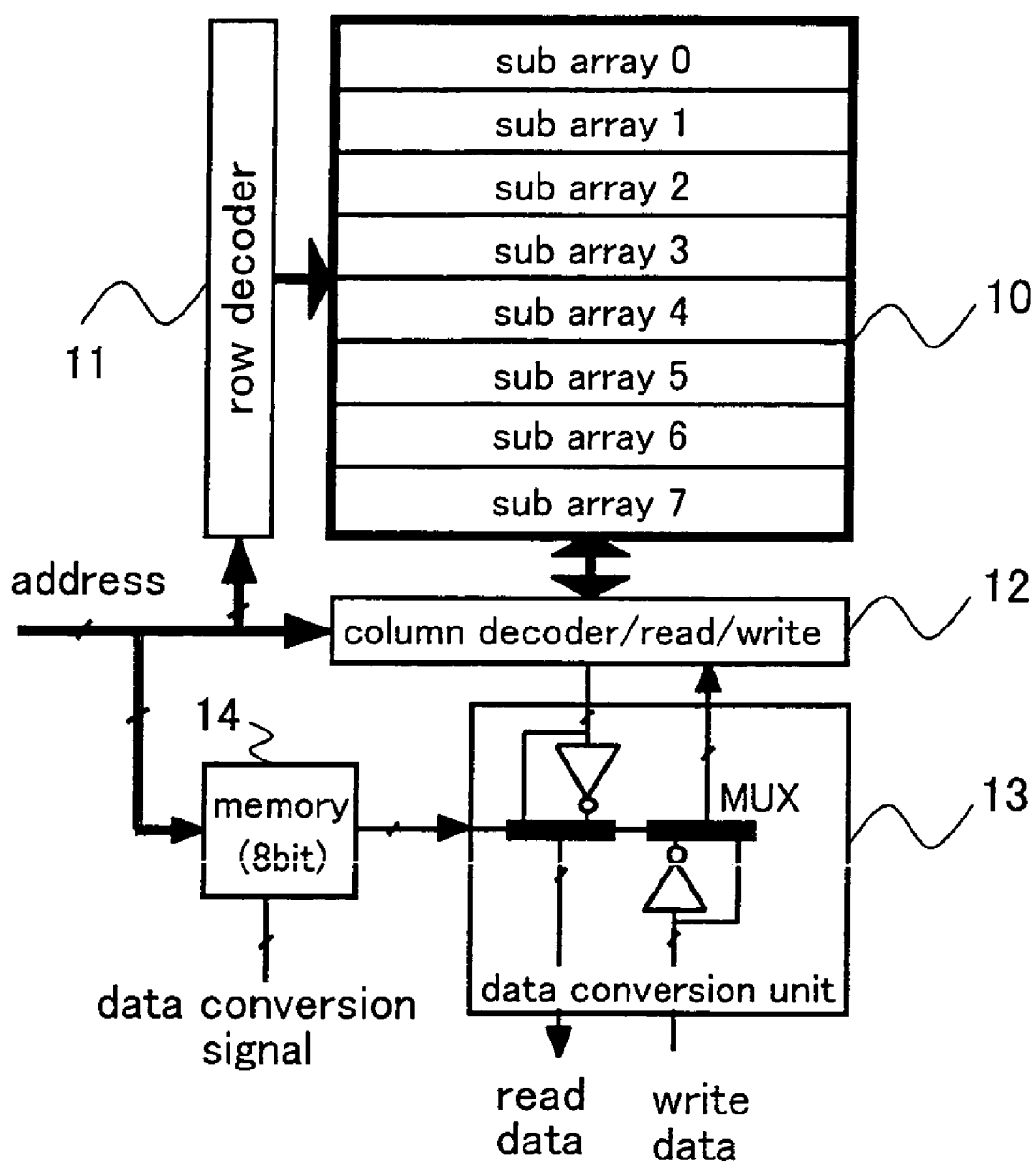
FIG. 16 is a block diagram illustrating a configuration of a nonvolatile memory device according to a modification of the embodiment 7.

Further, as shown in FIG. 16, the array 10 may be divided into a plurality of sub arrays, wherein the data conversion unit 13 controls each sub array. In that manner, there is a higher chance for the reuse of the nonvolatile memory device than in the case of dealing with the entire array.

Embodiment 8

According to an embodiment 8 of the present invention, data in a memory cell, where charge loss or charge gain is generated, is converted and written/read so that a nonvolatile memory device can be reused.

Figure 17:
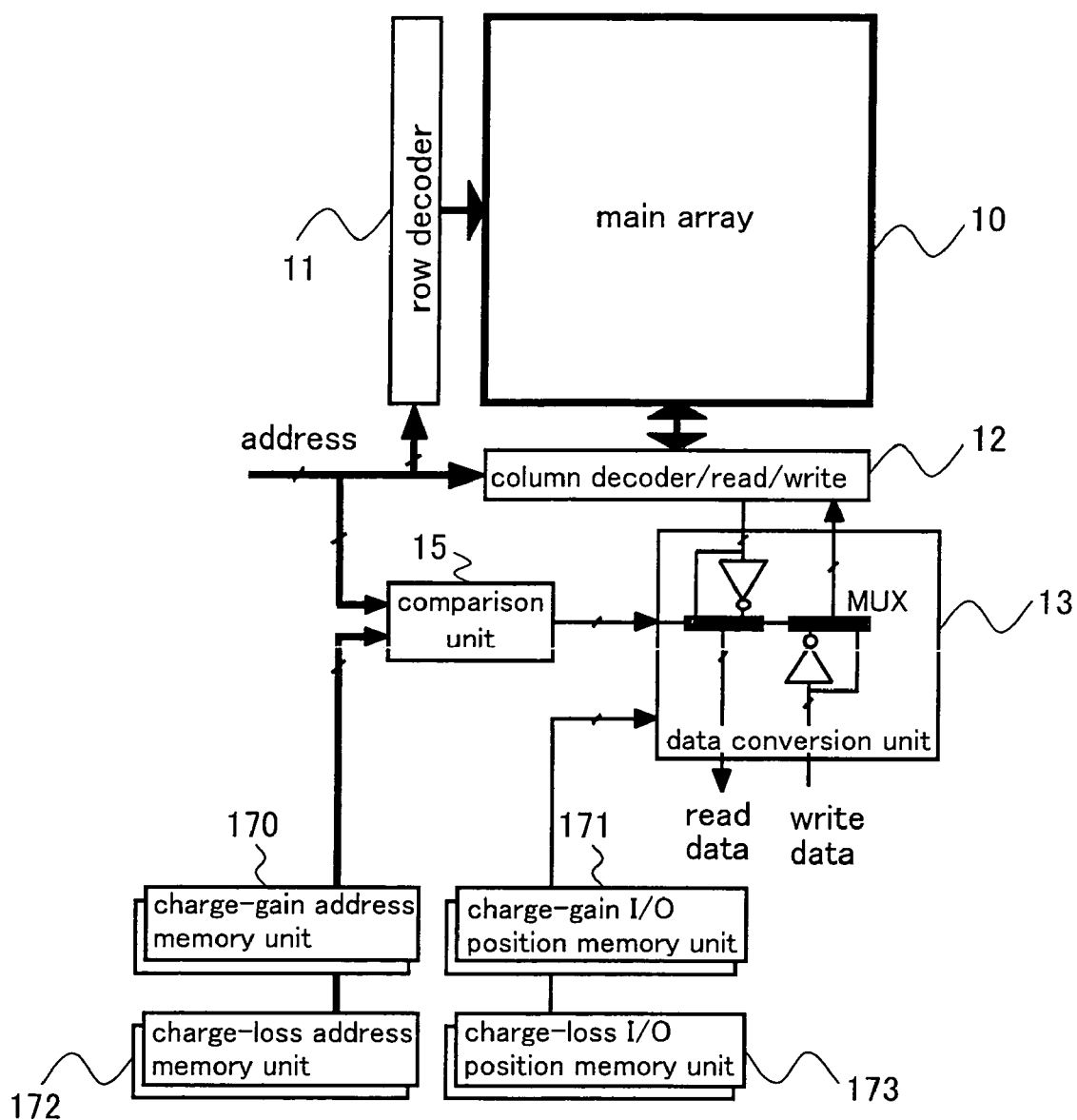
FIG. 17 is a block diagram illustrating a configuration of a nonvolatile memory device according to an embodiment 8 of the present invention.

In FIG. 17 showing a nonvolatile memory device according to the embodiment 8, a reference numeral 15 denotes a comparison unit for comparing addresses, a reference numeral 170 denotes a charge-gain address memory unit for memorizing an address of the memory cell where the charge gain is generated, a reference numeral 171 denotes a charge-gain I/O position memory unit for memorizing an I/O position of the memory cell where the charge gain is generated, a reference numeral 172 denotes a charge-loss address memory unit for memorizing an address of the memory cell where the charge loss is generated, and a reference numeral 173 denotes a charge-loss I/O position memory unit for memorizing an I/O position of the memory cell where the charge loss is generated. Any other component in the drawing is identical to those in FIG. 1. Therefore, they are simply provided with the same reference numerals, thereby omitting the description.

It is assumed that the charge loss is generated in one of the memory cells, that is, "1" in the write data increases the threshold value of the memory cell, while "0" decreases the threshold value of the memory cell.

Before the data is written in the memory cells in the array 10, an address and I/O position of the memory cell, where the charge loss is generated, are respectively written in the charge-loss address memory unit 172 and charge-loss I/O position memory unit 173. After the data writing with respect to the memory cells in the array 10 starts, in the case where an inputted address and the address of the charge-loss address memory unit 172 are identical to each other and the data of the charge-loss I/O position memory unit 173 is "0", the data conversion unit 13 outputs "0" without change, while, when the data of the charge-loss I/O position memory unit 173 is "1", converts the data to "0" and outputs it.

According to the present embodiment, the threshold of the memory cell, where the charge loss is generated, is maintained low, enabling the nonvolatile memory device to be reused.

Embodiment 9

According to an embodiment 9 of the present invention, in the case where data is the quaternary data, the data in the memory cell, where the charge loss or the charge gain is generated, is converted and written/read so that a nonvolatile memory device can be reused.

Figure 18:
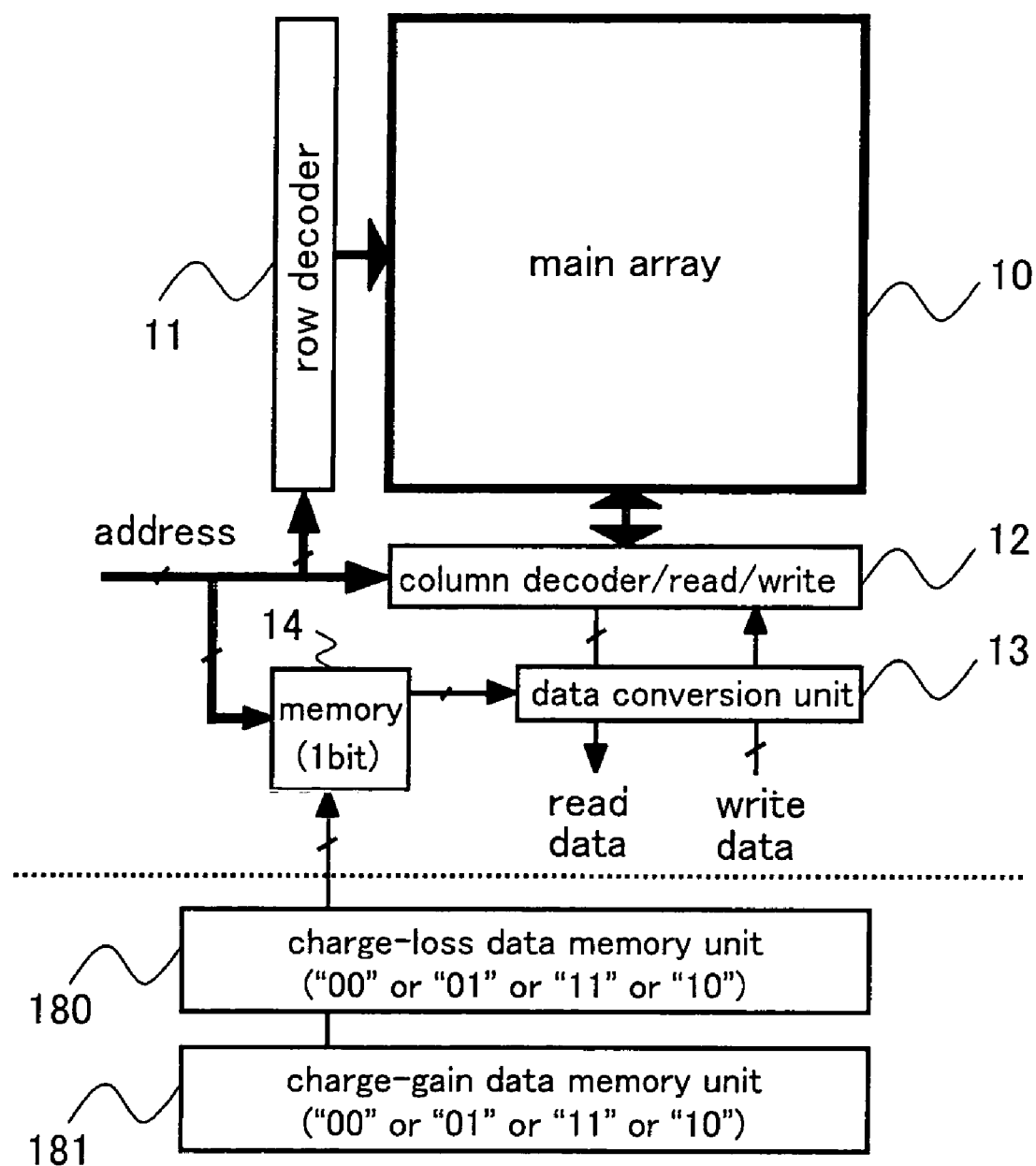
FIG. 18 is a block diagram illustrating a configuration of a nonvolatile memory device according to an embodiment 9 of the present invention.

In FIG. 18 showing a nonvolatile memory device according to the embodiment 9, a reference numeral 180 denotes a charge-loss data memory unit for memorizing the data written in the memory cell where the charge loss is generated, and a reference numeral 181 denotes a charge-gain data memory unit for memorizing the data written in the memory cell where the charge gain is generated.

It is assumed that the charge loss is generated in one of the memory cells. In the relationship between the threshold of the memory cells and the write data, the data arrangement is "10", "11", "01", and "00" in the order of the higher threshold.

When the data is written in all of the memory cells, "11" written in the memory cell, where the charge loss is generated, is written in the charge-loss data memory unit 180 and the memory unit 14. The data conversion unit 13 determines the logic of the write data so that the thresholds of all of the memory cells in the array 10, where "11" outputted from the memory unit 14 is written, are converted to "00" of the minimum threshold.

According to the present embodiment, the data written in the memory cell, where the charge loss is generated, is utilized to thereby reuse the nonvolatile memory device.

The foregoing example was described in the case of the quaternary data, however, the reuse of the nonvolatile memory device can be effectively obtained in the same manner by applying the same configuration to the octal data and hexadecimal data.

Figure 19:
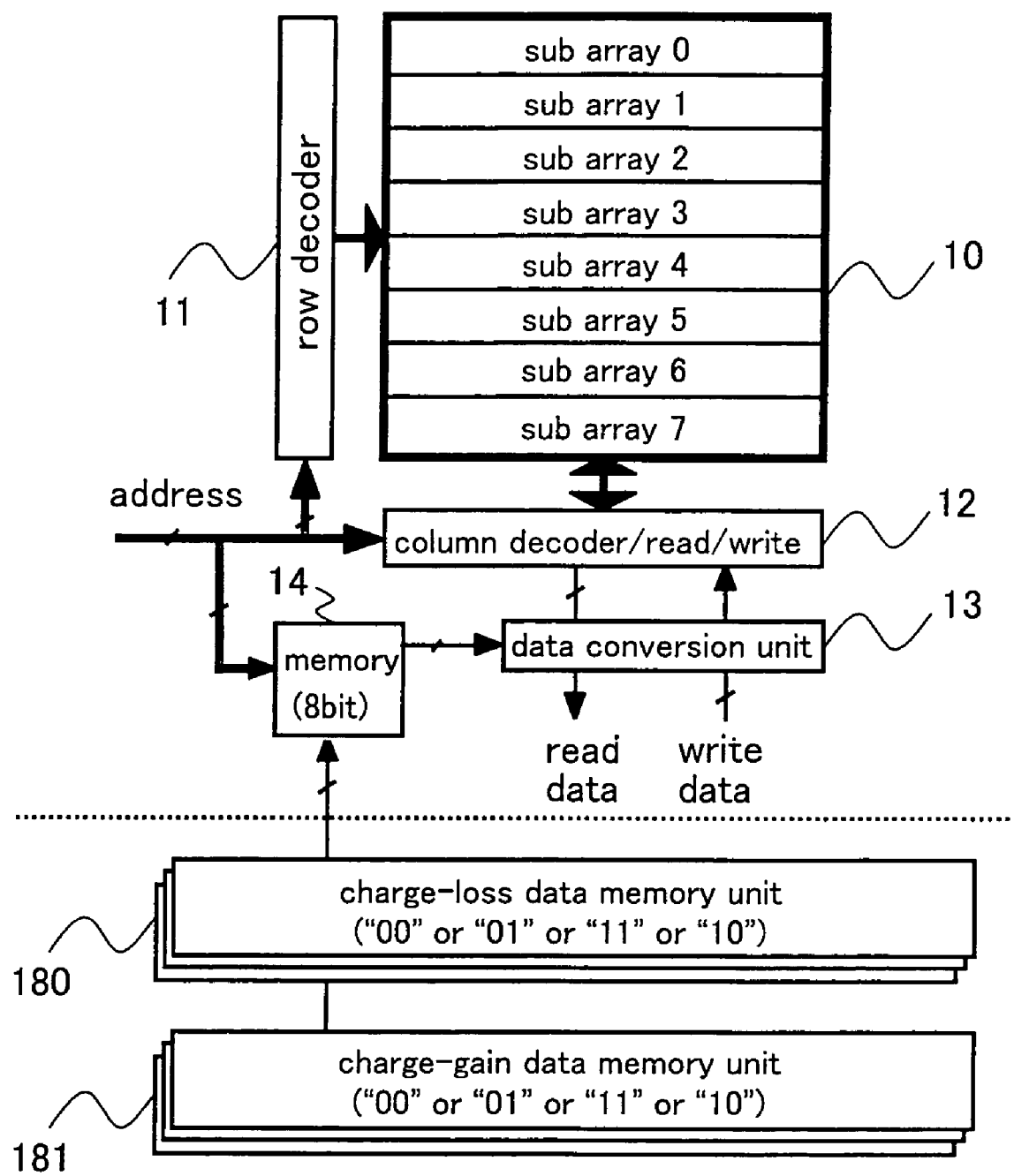
FIG. 19 is a block diagram illustrating a configuration of a nonvolatile memory device according to a modification of the embodiment 9.

Further, as shown in FIG. 19, the array 10 may be divided into a plurality of sub arrays to thereby execute the data conversion per sub array. In that manner, there is a higher chance for the reuse than in the case of dealing with the entire array.

The charge-loss data memory unit 180 and charge-gain data memory unit 181 in an area below a dotted line are not necessarily disposed in the present memory device, and may be disposed in an external apparatus such as a writer.

As thus far described, according to the present invention, the polarity of the data is converted into the polarity superior in the data retention characteristic of the memory cells when the data is written to thereby improve the data retention characteristic.

Further, the data of the memory cell, where the "0" degeneracy or the "1" degeneracy is generated, is converted and written/read so that the nonvolatile memory device can be reused.

Further, the data of the memory cell, where the charge loss or charge gain is generated, is converted and written/read to thereby reuse the nonvolatile memory device.

Further, the form of converting the write data according to the present invention can be utilized as a security function against a third party who unjustly tries to steal the data from outside.

The components constituting the control system in the respective embodiments can be realized by means of software.

From the above description, it will be apparent what the present invention provides.

What is claimed is:

1. A nonvolatile memory device comprising:
   a memory cell array;
   a writing unit for writing data in the array;
   first and second counter units for respectively counting threshold increase data and threshold decrease data for write data with respect to the writing unit;
   a comparison unit for comparing the count value of the first counter unit and the count value of the second counter unit;
   a memory unit for memorizing a comparison result of the comparison unit; and
   a data conversion unit for, determining whether or not a polarity of the write data is converted in accordance with information of the memory unit and outputting the data to the writing unit.

2. A nonvolatile memory device as claimed in claim 1, wherein
   the array is divided into a plurality of sub arrays, and
   the memory unit memorizes the comparison result of the comparison unit corresponding to each sub array.

3. A nonvolatile memory device comprising:
   a memory cell array;
   a writing unit for writing data in the array;
   a counter unit for incrementing (or decrementing) write data with respect to the writing unit in the case of threshold increase data and decrementing (or incrementing) the write data in the case of threshold decrease data;
   a memory unit for memorizing a count result of the counter unit; and
   a data conversion unit for determining whether or not a polarity of the write data is converted in accordance with information of the memory unit and outputting the data to the writing unit.

4. A nonvolatile memory device as claimed in claim 3, wherein
   the array is divided into a plurality of sub arrays, and
   the memory unit memorizes the count result of the counter unit corresponding to each sub array.

5. A nonvolatile memory device comprising:
   a memory cell array;
   a writing unit for writing data in the array;
   a plurality of counter units for respectively counting a plurality of multi-value data for setting voltages of memory cells to a plurality of threshold voltages;
   a comparison unit for comparing respective count values of the plurality counter units;
   a memory unit for memorizing a comparison result of the comparison unit; and
   a data conversion unit for determining whether or not a polarity of write data is converted in accordance with information of the memory unit and outputting the data to the writing unit.

6. A nonvolatile memory device as claimed in claim 5, wherein
   the array is divided into a plurality of sub arrays, and
   the memory unit memorizes the comparison result of the comparison unit corresponding to each sub array.

7. A nonvolatile memory device as claimed in claim 5, wherein
   an encoder and a decoder are respectively provided in an input portion and an output portion of the memory unit.

8. A nonvolatile memory device as claimed in claim 7, wherein the array is divided into a plurality of sub arrays, and
the memory unit memorizes the comparison result of the comparison unit corresponding to each sub array.

9. A nonvolatile memory device comprising:
a memory cell array;
a writing unit for writing data in the array;
first and second counter units for respectively counting write data with respect to memory cells, wherein MSB is 1, and write data with respect to the memory cells, wherein MSB is 0;
a comparison unit for comparing count values of the first and second counter units;
a memory unit for memorizing a comparison result of the comparison unit; and
a data conversion unit for determining whether or not a polarity of the write data is converted based on information of the memory unit and outputting the data to the writing unit.

10. A nonvolatile memory device as claimed in claim 9, wherein
the array is divided into a plurality of sub arrays, and
the memory unit memorizes the comparison result of the comparison unit corresponding to each sub array.

11. A nonvolatile memory comprising:
a memory cell array;
a writing unit for writing data in the array;
a counter unit for counting data for setting voltages of memory cells to a maximum threshold voltage or data for setting the voltages of the memory cells to a minimum threshold voltage;
a comparison unit for comparing a count value of the counter unit and half a value of the total number of the memory cells in the array;
a memory unit for memorizing a comparison result of the comparison unit; and
a data conversion unit for determining whether or not a polarity of write data is converted in accordance with information of the memory unit and outputting the data to the writing unit.

12. A nonvolatile memory device as claimed in claim 11, wherein
the array is divided into a plurality of sub arrays, and
the memory unit memorizes the comparison result of the comparison unit corresponding to each sub array.

13. A nonvolatile memory device comprising:
a memory cell array;
a writing unit for writing data in the array;
a counter unit for counting data for setting voltages of memory cells to a maximum threshold voltage or data for setting the voltages of the memory cells to a minimum threshold voltage, wherein MSB is 1 when a count value reaches half a value of a total number of the memory cells in the array;
a memory unit for memorizing the MSB of the counter unit; and
a data conversion unit for determining whether or not a polarity of write data is converted in accordance with information of the memory unit and outputting the data to the writing unit.

14. A nonvolatile memory device as claimed in claim 13, wherein
the array is divided into a plurality of sub arrays, and
the memory unit memorizes the MSB of the counter unit corresponding to each sub array.

15. A nonvolatile memory device comprising:
a memory cell array;
a reading unit for reading data whose polarity is converted and written in memory cells;
a memory unit for memorizing data conversion information; and
a data conversion unit for restoring the data from the reading unit to data prior to the conversion in accordance with the data conversion information of the memory unit,
wherein the array is divided into a plurality of sub arrays, and the memory unit memorizes the data conversion information corresponding to each sub array.

16. A nonvolatile memory device comprising:
a memory cell array;
a writing unit for writing data in the array;
a memory unit for memorizing data conversion information; and
a data conversion unit for converting data in a memory cell subjected to the generation of "0" degeneracy or "1" degeneracy in accordance with the data conversion information and outputting the data to the writing unit,
wherein the array is divided into a plurality of sub arrays, and the memory unit memorizes the data conversion information corresponding to each sub array.

17. A nonvolatile memory device comprising:
a memory cell array;
a reading unit for reading data in the memory cell subjected to the generation of the "0" degeneracy or "1" degeneracy, which is written after conversion;
a memory unit for memorizing data conversion information; and
a data conversion unit for restoring the data from the reading unit to data prior to the conversion in accordance with the data conversion information of the memory unit,
wherein the array is divided into a plurality of sub arrays, and the memory unit memorizes the data conversion information corresponding to each sub array.

18. A nonvolatile memory device comprising:
a memory cell array;
a writing unit for writing data in the array;
a memory unit for memorizing an address and I/O of a memory cell where charge loss or charge gain is generated;
a comparison unit for comparing the address of the memory unit and an address inputted for writing the data in the array and outputting a comparison result together with information of the I/O; and
a data conversion unit for determining whether or not a polarity of write data is converted in accordance with the comparison result and the I/O information of the comparison unit and outputting the data to the writing unit.

19. A nonvolatile memory device comprising:
a memory cell array;
a writing unit for writing data in the array;
a memory unit for memorizing data of a memory cell where charge loss or charge gain is generated; and
a data conversion unit for determining whether or not a polarity of write data is converted in accordance with information of the memory unit and outputting the data to the writing unit,
wherein the array is divided into a plurality of sub arrays, and the memory unit memorizes the data of the memory cell, where the charge loss or the charge gain is generated, corresponding to each sub array.

20. A nonvolatile memory device comprising:
a memory cell array;
a reading unit for reading data of a memory cell subjected to the generation of the charge loss or charge gain, which is written after the conversion;
a memory unit for memorizing data conversion information; and
a data conversion unit for restoring the data from the reading unit to data prior to the conversion in accordance with the data conversion information of the memory unit,
wherein the array is divided into a plurality of sub arrays, and the memory unit memorizes the data conversion information corresponding to each sub array.

* * * * *